United States Patent
Hiramoto et al.

(10) Patent No.: US 8,289,422 B2
(45) Date of Patent: Oct. 16, 2012

(54) IMAGE CAPTURE DEVICE

(75) Inventors: Masao Hiramoto, Osaka (JP); Yoshiaki Sugitani, Nara (JP); Kazuya Yonemoto, Osaka (JP); Seiji Nishiwaki, Hyogo (JP); Masaaki Suzuki, Osaka (JP)

(73) Assignee: Panasonic Corporation, Osaka (JP)

( * ) Notice: Subject to any disclaimer, the term of this patent is extended or adjusted under 35 U.S.C. 154(b) by 280 days.

(21) Appl. No.: 12/919,520

(22) PCT Filed: Jan. 5, 2010

(86) PCT No.: PCT/JP2010/000026
§ 371 (c)(1),
(2), (4) Date: Aug. 26, 2010

(87) PCT Pub. No.: WO2010/082455
PCT Pub. Date: Jul. 22, 2010

(65) Prior Publication Data
US 2011/0007179 A1   Jan. 13, 2011

(30) Foreign Application Priority Data

Jan. 14, 2009   (JP) .................................. 2009-005475

(51) Int. Cl.
*H04N 5/335* (2011.01)
(52) U.S. Cl. ......... 348/273; 348/259; 348/336; 348/294
(58) Field of Classification Search .............. 348/222.1, 348/242, 253, 237, 263, 265, 266, 259, 272, 348/273, 274, 275, 276, 277, 340, 336, 335, 348/294; 257/291, 294, 432, 435, 436; 250/208.1; 438/69
See application file for complete search history.

(56) References Cited

U.S. PATENT DOCUMENTS
6,882,364 B1   4/2005   Inuiya et al.
(Continued)

FOREIGN PATENT DOCUMENTS
JP   59-090467   5/1984
(Continued)

OTHER PUBLICATIONS
International Search Report for corresponding International Application No. PCT/JP2010/000026 mailed Apr. 6, 2010.
(Continued)

*Primary Examiner* — Aung S Moe
(74) *Attorney, Agent, or Firm* — Renner, Otto, Boisselle & Sklar, LLP

(57) ABSTRACT

The solid state image sensor of this invention includes multiple units, each of which includes first and second photosensitive cells $2a$, $2b$ and a dispersive element $1a$ facing the first cell $2a$. The element $1a$ passes a part of incoming light with a first color component to the second cell $2b$. The first cell $2a$ receives a smaller quantity of light with the first color component than that of the light with the first color component incident on the dispersive element. The second cell $2b$ receives a greater quantity of light with the first color component than that of the light with the first color component incident on the dispersive element. The quantity of that part of the incoming light with the first color component is calculated based on the difference between photoelectrically converted signals supplied from the first and second cells $2a$ and $2b$ and information representing the ratio of the quantity of the light with the first color component received by the second cell to that of the part of the incoming light with the first color component.

11 Claims, 9 Drawing Sheets

U.S. PATENT DOCUMENTS

| | | | |
|---|---|---|---|
| 7,110,034 B2 * | 9/2006 | Suda | 348/340 |
| 7,863,633 B2 * | 1/2011 | Kato | 257/98 |
| 8,208,052 B2 * | 6/2012 | Hiramoto et al. | 348/294 |
| 2002/0003201 A1 | 1/2002 | Yu | |
| 2003/0063204 A1 | 4/2003 | Suda | |
| 2003/0156210 A1 | 8/2003 | Wako et al. | |
| 2007/0235756 A1 | 10/2007 | Kato | |
| 2011/0037869 A1 * | 2/2011 | Hiramoto et al. | 348/222.1 |
| 2011/0050941 A1 * | 3/2011 | Hiramoto et al. | 348/222.1 |
| 2011/0164156 A1 * | 7/2011 | Hiramoto et al. | 348/272 |
| 2011/0181763 A1 * | 7/2011 | Hiramoto et al. | 348/273 |
| 2012/0182453 A1 * | 7/2012 | Hiramoto et al. | 348/272 |

FOREIGN PATENT DOCUMENTS

| | | |
|---|---|---|
| JP | 2000-151933 | 5/2000 |
| JP | 2002-502120 | 1/2002 |
| JP | 2003-078917 | 3/2003 |
| JP | 2005-167356 | 6/2005 |
| JP | 2007-282054 | 10/2007 |

OTHER PUBLICATIONS

Form PCT/ISA/237 and a partial English translation for corresponding Application No. PCT/JP2010/000026 mailed Apr. 6, 2010.

* cited by examiner (a) $L=C_i+C_j+C_k$ (b) $L_{2a}=\alpha C_i+C_j+C_k$    (c) $L_{2b}=\beta C_i+C_j+C_k$ (a) $L'=C_i'+C_j'+C_k'$ (b) $L_{2a}'=\alpha C_i'+C_j'+C_k'$    (c) $L_{2b}'=\beta C_i'+C_j'+C_k'$

IMAGE CAPTURE DEVICE

TECHNICAL FIELD

The present invention relates to a solid-state image sensor structure for use in an image capture device.

BACKGROUND ART

Recently, the performance and functionality of digital cameras and digital movie cameras that use some solid-state imaging device such as a CCD and a CMOS (which will be sometimes referred to herein as an "image sensor") have been enhanced to an astonishing degree. In particular, the size of a pixel structure for use in a solid-state imaging device has been further reduced these days thanks to development of semiconductor device processing technologies, thus getting an even greater number of pixels and drivers integrated together in a solid-state imaging device. As a result, the resolution of an image sensor has lately increased significantly from one million pixels to ten million pixels in a matter of few years. Meanwhile, the greater the number of pixels in an image sensor, the lower the intensity of the light falling on a single pixel (which will be referred to herein as a "light intensity") and the lower the sensitivity of the mage capture device tends to be.

On top of that, in a normal color camera, a subtractive organic dye filter (i.e., color filter) that uses an organic pigment as a dye is arranged over each photosensing section of an image sensor, and therefore, the optical efficiency achieved is rather low. In a Bayer color filter, which uses a combination of one red (R) pixel, two green (G) pixels and one blue (B) pixel as a fundamental unit, the R filter transmits an R ray but absorbs G and B rays, the G filter transmits a G ray but absorbs R and B rays, and the B filter transmits a B ray but absorbs R and G rays. That is to say, each color filter transmits only one of the three colors of R, G and B and absorbs the other two colors. Consequently, the light ray used by each color filter is only approximately one third of the visible radiation falling on that color filter.

To overcome such a problem of decreased sensitivity, Patent Document No. 1 discloses a technique for increasing the intensity of the light received by attaching an array of micro lenses to a photodetector section of an image sensor. According to this technique, the incoming light is condensed with those micro lenses, thereby substantially increasing the aperture ratio. And this technique is now used in almost all solid-state imaging devices. It is true that the aperture ratio can be increased substantially by this technique but the decrease in optical efficiency by color filters still persists.

Thus, to avoid the decrease in optical efficiency and the decrease in sensitivity at the same time, Patent Document No. 2 discloses a solid-state imaging device that has a structure for taking in as much incoming light as possible by using dichroic mirrors and micro lenses in combination. Such a device uses a combination of dichroic mirrors, each of which does not absorb light but selectively transmits only a component of light falling within a particular wavelength range and reflects the rest of the light falling within the other wavelength ranges. Each dichroic mirror selects only a required component of the light, makes it incident on its associated photosensing section and transmits the rest of the light. FIG. 14 is a cross-sectional view of such an image sensor as the one disclosed in Patent Document No. 2.

In the image sensor shown in FIG. 14, the light that has reached a condensing micro lens 11 has its luminous flux adjusted by an inner lens 12, and then impinges on a first dichroic mirror 13, which transmits a red (R) ray but reflects rays of the other colors. The light ray that has been transmitted through the first dichroic mirror 13 is then incident on a photosensing section cell 23 that is located right under the first dichroic mirror 13. On the other hand, the light ray that has been reflected from the first dichroic mirror 13 impinges on a second dichroic mirror 14 adjacent to the first dichroic mirror 13. The second dichroic mirror 14 reflects a green (G) ray and transmits a blue (B) ray. The green ray that has been reflected from the second dichroic mirror 14 is incident on a photosensing section 24 that is located right under the second dichroic mirror 14. On the other hand, the blue ray that has been transmitted through the second dichroic mirror 14 is reflected from a third dichroic mirror 15 and then incident on a photosensing section 25 that is located right under the dichroic mirror 15. In this manner, in the image sensor shown in FIG. 14, the visible radiation that has reached the condensing micro lens 11 is not lost but its RGB components can be detected by the three photosensing sections non-wastefully.

Meanwhile, a technique that uses a micro prism is also disclosed in Patent Document No. 3. According to that technique, the incoming light is split by a micro prism 16 into red (R), green (G) and blue (B) rays as shown in FIG. 15, which are then received by their associated photosensing sections 23, 24 and 25, respectively. Even with such a technique, the R, G and B components can also be detected without causing optical loss.

According to the techniques disclosed in Patent Documents Nos. 2 and 3, however, the image sensor should have as many photosensing sections as the number of color components to separate. That is why to sense red, green and blue rays, for example, the number of photosensing sections provided should be tripled compared to a situation where conventional color filters are used.

Thus, to overcome such problems with the prior art, Patent Document No. 4 discloses a technique for increasing the optical efficiency by using dichroic mirrors and reflected light, although some loss of the incoming light is involved. FIG. 16 is a partial cross-sectional view of an image sensor that adopts such a technique. As shown in FIG. 16, dichroic mirrors 32 and 33 are embedded in a light-transmitting resin 31. Specifically, the dichroic mirror 32 transmits a G ray and reflects R and B rays, while the dichroic mirror 33 transmits an R ray and reflects G and B rays.

Such a structure cannot receive a B ray at its photosensing section but can sense R and G rays entirely under the following principle. First, if an R ray impinges on the dichroic mirrors 32 and 33, the R ray is reflected from the dichroic mirror 32, is totally reflected from the interface between the light-transmitting resin 31 and the air, and then strikes the dichroic mirror 33. Then, almost all of the R ray that has impinged on the dichroic mirror 33 will be incident on the photosensing section by way of the organic dye filter 35 and the micro lens 36 that transmit the R ray, even though only a part of the light is reflected from the metal layer 37. On the other hand, if a G ray impinges on the dichroic mirrors 32 and 33, the G ray is reflected from the dichroic mirror 33, is totally reflected from the interface between the light-transmitting resin 31 and the air, and then strikes the dichroic mirror 32. Then, almost all of the G ray that has impinged on the dichroic mirror 32 will eventually be incident on the photosensing section with virtually no loss by way of the organic dye filter 34 and the micro lens 36 that transmit the G ray.

According to the technique disclosed in Patent Document No. 5, only one of the three colors of RGB is lost but light rays of the other two colors can be received with almost no loss based on the principle described above. That is why there is no need to provide photosensing sections for all of the three colors of RGB. In this case, comparing such an image sensor to an image sensor that uses only organic dye filters, it can be seen that the optical efficiently can be doubled by this technique. Nevertheless, even if such a technique is adopted, the optical efficiency cannot be 100%, as one out of the three colors should be sacrificed.

CITATION LIST

Patent Literature

Patent Document No. 1: Japanese Patent Application Laid-Open Publication No. 59-90467
Patent Document No. 2: Japanese Patent Application Laid-Open Publication No. 2000-151933
Patent Document No. 3: PCT International Application Japanese National Phase Publication No. 2002-502120
Patent Document No. 4: Japanese Patent Application Laid-Open Publication No. 2003-78917

SUMMARY OF INVENTION

Technical Problem

According to the conventional technologies, if light-absorbing color filters are used, the number of photosensing sections to provide does not have to be increased significantly but the optical efficiency achieved will be low. Nevertheless, if dichroic mirrors or dichroic prisms are used, then the optical efficiency will be high but the number of photosensing sections to provide should be increased considerably. Furthermore, according to the technique disclosed in Patent Document No. 5 that uses dichroic mirrors and reflection in combination, one out of the light rays in the three colors should be lost.

It is therefore an object of the present invention to provide a color image capturing technique that can be used to achieve higher optical efficiently even without increasing the number of photosensing sections and to obtain color information even if light splitting is insufficient.

Solution to Problem

An image capture device according to the present invention includes: a number of pixels that are arranged two-dimensionally; a dispersive element array for splitting a part of incoming light, which is going to enter the respective pixels and which has at least one color component, so that a differential signal of two of the pixels is proportional to the quantity of that color component part of the incoming light entering the respective pixels; and a signal processing section for generating a color signal, representing the quantity of that color component part of the incoming light, based on not only the ratio of the differential signal to the quantity of that color component part of the incoming light entering the respective pixels but also the differential signal itself.

Another image capture device according to the present invention includes: a solid state image sensor; an optical system for producing an image on an imaging area of the solid state image sensor; and a signal processing section for processing an electrical signal supplied from the solid state image sensor. The solid state image sensor includes a photosensitive cell array including a number of photosensitive cells, and a dispersive element array including a number of dispersive elements. The photosensitive cell array and the dispersive element array are formed of a number of units. Each unit includes first and second photosensitive cells, and a dispersive element, which is arranged to face the first photosensitive cell. If the light that would be directly incident on each of the photosensitive cells, were it not for the dispersive element array, is called "that photosensitive cell's light", the dispersive element array is designed to make a part and another part of the first photosensitive cell's light, both of which fall within a first wavelength range associated with a first color component and of which the quantities define first and second ratios, respectively, with respect to the quantity of light that also falls within the first wavelength range and that is included in the first photosensitive cell's light, incident on the first and second photosensitive cells, respectively. The first and second photosensitive cells respectively output first and second photoelectrically converted signals representing the quantities of the light they received. The signal processing section outputs a color signal representing the quantity of the light that falls within the first wavelength range and that is included in the first photosensitive cell's light by performing processing, including calculating the difference between the first and second photoelectrically converted signals, based on the first and second ratios.

The signal processing section may include a memory, and information about the first and second ratios may be stored in the memory.

The first dispersive element may be designed to make a part and at least another part of light that falls within the first wavelength range and that is included in the first photosensitive cell's light incident on the first photosensitive cell.

The first dispersive element may be designed to make all of the light that falls within the first wavelength range and that is included in the first photosensitive cell's light incident on the first photosensitive cell except a part of that light that is incident on the second photosensitive cell.

The first dispersive element may be designed to make all of the light that is included in the first photosensitive cell's light incident on the first photosensitive cell except a part of that light that is incident on the second photosensitive cell.

In one preferred embodiment of the present invention, each of the units further includes: third and fourth photosensitive cells, and a second dispersive element that is arranged to face the third photosensitive cell. The dispersive element array is designed to make a part and another part of the first photosensitive cell's light, both of which fall within a second wavelength range associated with a second color component and of which the quantities define third and fourth ratios, respectively, with respect to the quantity of light that also falls within the second wavelength range and that is included in third photosensitive cell's light, incident on the third and fourth photosensitive cells, respectively. The third and fourth photosensitive cells respectively output third and fourth photoelectrically converted signals representing the quantities of the light they received. The signal processing section outputs a color signal representing the quantity of the light that falls within the second wavelength range and that is included in the third photosensitive cell's light by performing processing, including calculating the difference between the third and fourth photoelectrically converted signals, based on the third and fourth ratios.

In another preferred embodiment of the present invention, each of the units further includes a second dispersive element that is arranged to face the second photosensitive cell. The first dispersive element makes a part of light that falls within a second wavelength range associated with a second color component and that is included in the first photosensitive cell's light incident on the second photosensitive cell and also makes not only the rest of the light that falls within the second wavelength range and that is included in the first photosensitive cell's light but also light that falls within a third wavelength range associated with a third color component and that is included in the first photosensitive cell's light, incident on the first photosensitive cell. The second dispersive element makes a part and the rest of the light that falls within the second wavelength range and that is included in second photosensitive cell's light incident on the first and second photosensitive cells, respectively. The quantity of the light falling within the second wavelength range that the first dispersive element makes incident on the second photosensitive cell is equal to that of the light falling within the second wavelength range that the second dispersive element makes incident on the first photosensitive cell.

In still another preferred embodiment of the present invention, each of the units further includes a second dispersive element that is arranged to face the second photosensitive cell. The first dispersive element makes a part of light that falls within a second wavelength range associated with a second color component and that is included in the first photosensitive cell's light incident on a third photosensitive cell, which is included in a first adjacent unit, and also makes not only the rest of the light that falls within the second wavelength range and that is included in the first photosensitive cell's light but also light that falls within a third wavelength range associated with a third color component and that is included in the first photosensitive cell's light, incident on the first photosensitive cell. The second dispersive element makes a part of light that falls within the second wavelength range and that is included in second photosensitive cell's light, incident on the first photosensitive cell and a fourth photosensitive cell, which is included in a second adjacent unit, so that the quantities of the light received by the first and fourth photosensitive cells are equal to each other, and also makes the rest of the light that is included in the second photosensitive cell's light incident on the second photosensitive cell. The quantity of the light falling within the second wavelength range that the first dispersive element makes incident on the third photosensitive cell is equal to the sum of the quantities of the light rays falling within the second wavelength range that the second dispersive element makes incident on the first and fourth photosensitive cells.

In yet another preferred embodiment of the present invention, each of the units may further include: a third photosensitive cell; a second dispersive element, which is arranged to face the second photosensitive cell; a third dispersive element, which is arranged to face the third photosensitive cell; and a fourth dispersive element, which is arranged to face the first photosensitive cell. The first dispersive element makes light that falls within a third wavelength range associated with a third color component and that is included in the first photosensitive cell's light, incident on the first photosensitive cell. The fourth dispersive element makes a part of light that falls within a second wavelength range associated with a second color component and that is included in the first photosensitive cell's light incident on the third photosensitive cell and also makes not only the rest of the light that falls within the second wavelength range and that is included in the first photosensitive cell's light but also light that falls within the third wavelength range and that is included in the first photosensitive cell's light incident on the first photosensitive cell. The second dispersive element makes a part and the rest of light that falls within the second wavelength range and that is included in the second photosensitive cell's light incident on the third and second photosensitive cells, respectively. The third dispersive element makes a part and the rest of light that falls within the first wavelength range and that is included in the third photosensitive cell's light incident on the second and third photosensitive cells, respectively. The quantity of the light falling within the first wavelength range that the first dispersive element makes incident on the second photosensitive cell is equal to that of the light falling within the first wavelength range that the third dispersive element makes incident on the second photosensitive cell. The quantity of the light falling within the second wavelength range that the first dispersive element makes incident on the third photosensitive cell is equal to that of the light falling within the second wavelength range that the second dispersive element makes incident on the third photosensitive cell. The third photosensitive cell outputs a third photoelectrically converted signal representing the quantity of the light received. The signal processing section outputs a color signal representing the quantity of the light associated with the second color component that is included in the first photosensitive cell's light by performing processing, including calculating the difference between the first and third photoelectrically converted signals, based on the ratio of the quantity of the light falling within the second wavelength range to be received by the third photosensitive cell to that of the light falling within the second wavelength range that is included in the first photosensitive cell's light.

A solid state image sensor according to the present invention includes: a photosensitive cell array including a number of photosensitive cells, and a dispersive element array including a number of dispersive elements. The photosensitive cell array and the dispersive element array are formed of a number of units, each of which includes first and second photosensitive cells and a dispersive element, which is arranged to face the first photosensitive cell. If the light that would be directly incident on each of the photosensitive cells, were it not for the dispersive element array, is called "that photosensitive cell's light", the dispersive element array is designed to make a part and another part of the first photosensitive cell's light, both of which fall within a first wavelength range associated with a first color component and of which the quantities define first and second ratios, respectively, with respect to the quantity of light that also falls within the first wavelength range and that is included in the first photosensitive cell's light, incident on the first and second photosensitive cells, respectively. And the first and second photosensitive cells respectively output first and second photoelectrically converted signals representing the quantities of the light received.

Advantageous Effects of Invention

An image capture device according to the present invention is designed to use an array of dispersive elements, which separates a light ray associated with at least one color component from incoming light, so that a signal representing the difference between two pixels is proportional to the quantity of the light associated with that color component and included in the incident light. That is why based on the ratio of the quantity of light represented by the differential signal to that of the light associated with that color component and included in the incident light on each pixel, a signal representing the quantity of light associated with one color component and included in the incident light can be obtained. For that reason, high optical efficiently can be achieved without increasing the number of photosensitive cells too much. In addition, even if light has not been split sufficiently due to the property or structure of the optical material used, information about the quantity of light associated with one color component and included in the incident light can still be obtained.

DESCRIPTION OF EMBODIMENTS

An image capture device as each and every preferred embodiment of the present invention includes a number of pixels that are arranged two-dimensionally on an imaging area (and which will be referred to herein as "photosensitive cells") and a dispersive element array, which splits a part of light that is going to be incident on an associated one of the pixels and that represents at least a first color component (which may be an R, G or B component, for example). On receiving light, each photosensitive cell subjects it to photoelectric conversion, thereby generating an electrical signal representing the quantity of the light received (i.e., a photoelectrically converted signal). The array of dispersive elements is designed so that a difference between the quantities of light with the first color component received by two neighboring pixels is proportional to the quantity of the light ray falling within a wavelength range associated with that first color component and included in the light incident on each pixel. In other words, the array of dispersive elements makes light rays with the first color component incident on two photosensitive cells at mutually different ratios to the quantity of the light ray with the first color component in the incident light. That is why if those ratios of the quantities of the light rays to that of the light ray with the first color component in the incident light, which are represented by the differential signal, are known, a color signal representing the quantity of the light ray with the first color component in the incident light can be generated.

Figure 1:
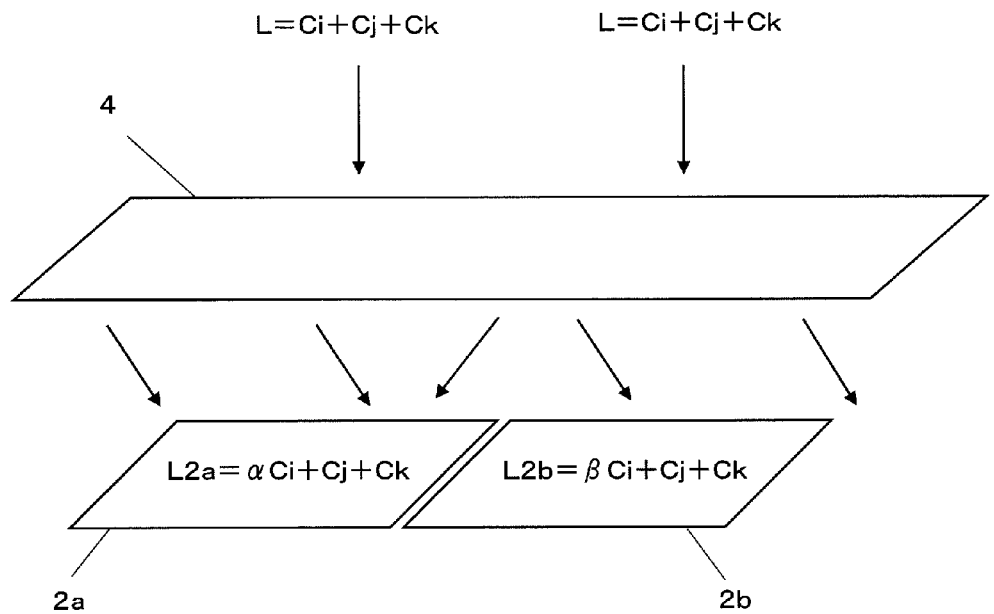
FIG. 1 is a schematic representation illustrating an arrangement of a dispersive element array and photosensitive cells, which can be used in any of various preferred embodiments of the present invention.

FIG. 1 illustrates an example in which a dispersive element array 4 makes light with a first color component incident on two photosensitive cells 2a and 2b at mutually different ratios. In the example shown in FIG. 1, the quantity of a part of the incoming light representing the first color component is identified by Ci, and the quantities of the other parts of the incoming light representing the other two color components are identified by Cj and Ck, respectively, and the overall quantity L of the incoming light is represented by L=Ci+Cj+Ck. As the incoming light is split by the dispersive element array 4, the photosensitive cell 2a receives a light ray with the first color component, of which the quantity is α times as large as Ci, while the photosensitive cell 2b receives a light ray with the first color component, of which the quantity is β times as large as Ci. In this case, α>β>0 is satisfied. As for the light rays with the other color components, on the other hand, there is no difference between the light received by the photosensitive cell 2a and the one received by the photosensitive cell 2b. Consequently, the quantities L2a and L2b of the light received by the photosensitive cells 2a and 2b can be represented by L2a=αCi+Cj+Ck and L2b=βCi+Cj+Ck, respectively.

Figure 2:
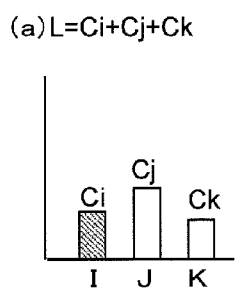
FIG. 2(a) shows a distribution of respective color components in incoming light with relatively low intensity.
FIGS. 2(b) and 2(c) show the quantities of the respective color components in the light rays received by the photosensitive cells 2a and 2b out of the incoming light shown in FIG. 2(a).
Figure 2:
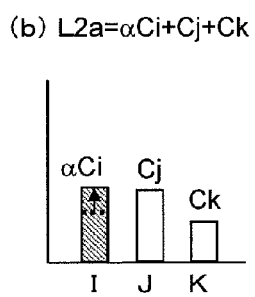
Figure 3:
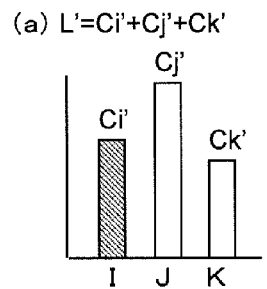
FIG. 3(a) shows a distribution of respective color components in incoming light with relatively high intensity.
FIGS. 3(b) and 3(c) show the quantities of the respective color components in the light rays received by the photosensitive cells 2a and 2b out of the incoming light shown in FIG. 2(a).
Figure 3:
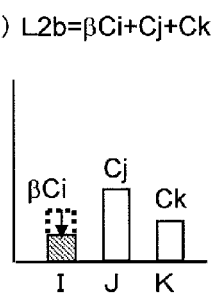
Figure 3:
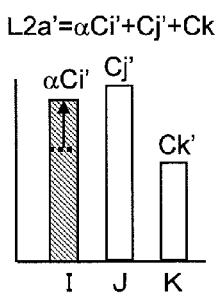

In the following example, the light ray with the first color component will be referred to herein as "I ray", and the light rays with the other two color components as "J ray" and "K ray", respectively, for convenience sake. FIG. 2(a) shows an exemplary distribution of I, J and K components in the incoming light. On the other hand, FIGS. 2(b) and 2(c) show the respective quantities of the I, J and K components in the light rays received by the photosensitive cells 2a and 2b out of the incoming light shown in FIG. 2(a). Meanwhile, FIG. 3(a) shows an exemplary distribution of the I, J and K components in the incoming light in which the quantities of the respective color components are greater than the ones shown in FIG. 2(a). And FIGS. 3(b) and 3(c) show the respective quantities of the I, J and K components in the light rays received by the photosensitive cells 2a and 2b out of the incoming light shown in FIG. 3(a).

In the example shown in FIGS. 2(a) to 2(c), the quantities of the I, J and K rays included in the incoming light are identified by Ci, Cj and Ck, respectively. Thus, the overall quantity L of the incoming light is given by L=Ci+Cj+Ck.

On the other hand, in the example shown in FIGS. 3(a) to 3(c), the quantities of the I, J and K rays included in the incoming light are identified by Ci'(>Ci), Cj' (>Ci) and Ck' (>Ck), respectively. Thus, the overall quantity L' of the incoming light is given by L'=Ci'+Cj'+Ck'. Since the incoming light is split by the dispersive element array 4, the quantities L2a and L2b of the light received by the photosensitive cells 2a and 2b in the example illustrated in FIGS. 2(a) to 2(c) are represented by the following Equations (1) and (2):

$$L2a = \alpha Ci + Cj + Ck \quad (1)$$

$$L2b = \beta Ci + Cj + Ck \quad (2)$$

In the same way, the quantities L2a' and L2b' of the light received by the photosensitive cells 2a and 2b in the example illustrated in FIGS. 3(a) to 3(c) are represented by the following Equations (3) and (4):

$$L2a' = \alpha Ci' + Cj' + Ck' \quad (3)$$

$$L2b' = \beta Ci' + Cj' + Ck' \quad (4)$$

By subtracting Equation (1) from Equation (2), the following Equation (5) is obtained:

$$L2b - L2a = (\beta - \alpha) Ci \quad (5)$$

In the same way, by subtracting Equation (3) from Equation (4), the following Equation (6) is obtained:

$$L2b' - L2a' = (\beta - \alpha) Ci' \quad (6)$$

As can be seen from these Equations (5) and (6), if the ($\beta - \alpha$) value is known in advance, the quantity of the part of the incoming light with the first color component (i.e., Ci and Ci') can be calculated irrespective of the overall quantity of the incoming light. That is to say, if the ratio of the quantity of the light represented by a differential signal between the two photosensitive cells to the quantity of that part of the incoming light with the first color component is known in advance, a color signal representing the quantity of that part of the incoming light with the first color component can be generated.

In each of various preferred embodiments of the present invention to be described below, information about the quantity of such a part of the incoming light entering respective pixels with a particular color component can be obtained based on the principle described above. The quantities of the rest of the incoming light with the other two color components can also be obtained under the same principle.

In FIG. 1, the dispersive element array 4 is illustrated as covering multiple photosensitive cells. However, one dispersive element may be arranged to face only one photosensitive cell. Also, the dispersive elements do not always have to be arranged to face every photosensitive cell. That is to say, some photosensitive cells may have no dispersive elements that face them. In any case, the effect of the present invention can be achieved so long as there is a difference in the quantity of a part of the incoming light with one color component between two photosensitive cells but the quantities of the rest of the incoming light with the other two color components are the same between the two photosensitive cells.

Hereinafter, specific preferred embodiments of the present invention will be described with reference to the accompanying drawings. In the following description, any pair of components shown in multiple drawings and having substantially the same function will be identified by the same reference numeral. Also, in the following description, "over", "right under", "diagonally below" or any other direction related term will be construed herein by the drawing being referred to. In a real world image capture device, however, the direction that its imaging area faces is always changing. That is why any of those direction related terms used in this description actually means any of various directions according to which direction the imaging area is now facing.

Embodiment 1

Figure 4:
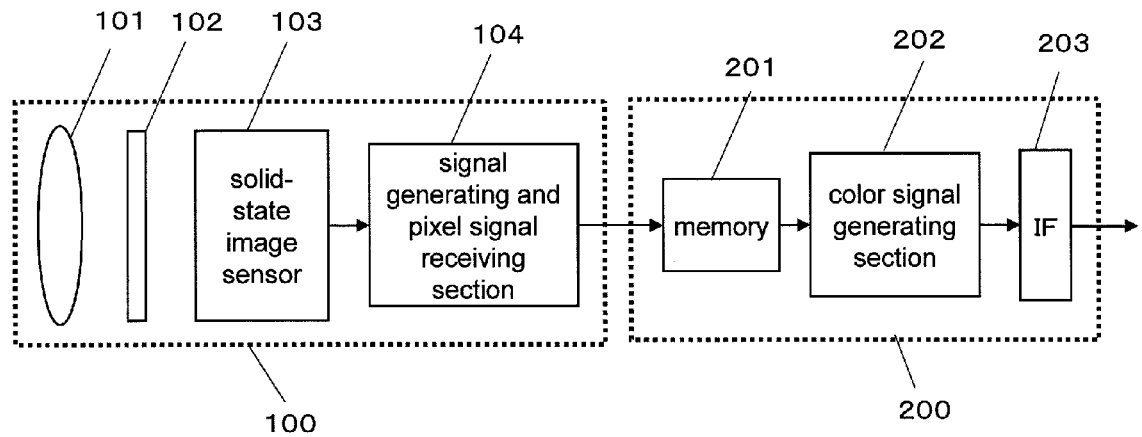
FIG. 4 is a block diagram illustrating an exemplary configuration for an image capture device as a first specific preferred embodiment of the present invention.

FIG. 4 is a block diagram illustrating an overall configuration for an image capture device as a first specific preferred embodiment of the present invention. The Image capture device shown in FIG. 4 includes an image capturing section 100 and a signal processing section 200 that receives a signal from the image capturing section 100 and generates a video signal. Hereinafter, the image capturing section 100 and the signal processing section 200 will be described.

The image capturing section 100 includes a lens 101 for imaging a given subject, an optical plate 102, a solid state image sensor 103 for converting optical information, which has been collected by imaging the subject through the lens 101 and the optical plate 102, into an electrical signal by photoelectric conversion, and a signal generating and pixel signal receiving section 104. In this case, the optical plate 102 is a combination of a quartz crystal low-pass filter for reducing a moiré pattern to be caused by a pixel arrangement with an infrared cut filter for filtering out infrared rays. The signal generating and pixel signal receiving section 104 generates a fundamental signal to drive the solid state image sensor 103 and receives a signal from the solid state image sensor 103 and passes it to the signal processing section 200.

The signal processing section 200 includes a memory 201 to store the signal supplied from the signal generating and image signal receiving section 104 and information about the ratio of the quantities of parts of the incoming light with a particular color component that are going to enter the respective pixels, a color signal generating section 202 for generating a color signal on a pixel-by-pixel basis using the data that has been read out from the image memory 201, and an interface (IF) section 203 that outputs the color signal to an external device.

It should be noted that this configuration is only an example and that according to the present invention, all components but the solid state image sensor 103 can be an appropriate combination of known elements. Hereinafter, a solid state image sensor 103 according to this preferred embodiment will be described.

Figure 5:
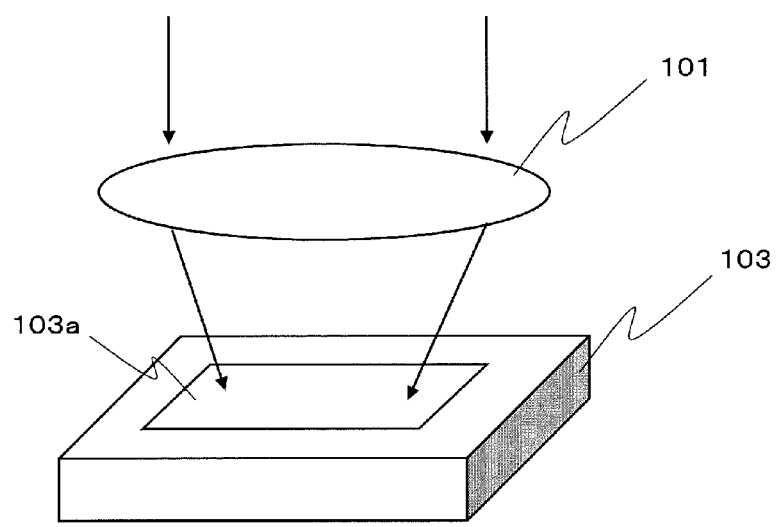
FIG. 5 is perspective view illustrating how a lens and an image sensor are arranged in the first preferred embodiment of the present invention.

FIG. 5 schematically illustrates how the light that has been transmitted through the lens 101 is incident on the solid state image sensor 103. On the imaging area 103a of the solid state image sensor 103, arranged two-dimensionally are a lot of photosensitive cells that form an array. Since the light is imaged by the lens 101 and processed by the low-pass filter, light (visible radiation) is incident on the imaging area 103a. The intensity of the light falling on the imaging area 103a (which will be referred to herein as an "incident light intensity") and the distribution of the incident light intensity according to the wavelength range vary with the point of incidence. Those photosensitive cells are typically photodiodes, each of which outputs an electrical signal representing the incident light intensity by photoelectric conversion (such a signal will be referred to herein as a "photoelectrically converted signal").

The solid state image sensor 103 is typically implemented as a CCD or a CMOS sensor and is fabricated by known semiconductor device processing. In the solid state image sensor 103 of this preferred embodiment, an array of dispersive elements is arranged so as to face that side with the array of photosensitive cells.

An image capture device according to this preferred embodiment can generate a color image signal by getting the incoming light split by an array of dispersive elements. In this device, the output signal of a single photosensitive cell includes a superposition of signal components representing light rays falling within multiple different wavelength ranges. By making a computation on the output signal of one photosensitive cell and that of another photosensitive cell, color signals representing the respective colors can be extracted.

Figure 12:
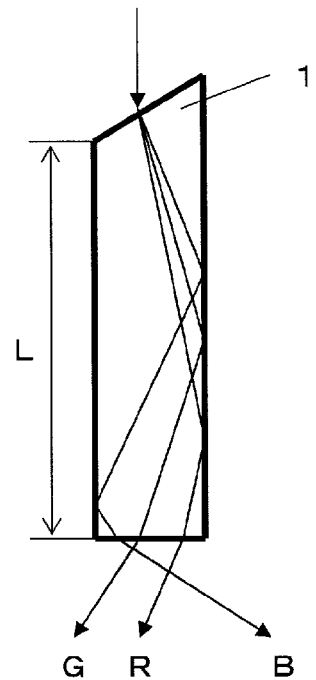
FIG. 12 illustrates the appearance of a micro prism for making a part of incoming light incident on an adjacent pixel.

The dispersive element of this preferred embodiment may be a micro prism as shown in FIG. 12. If light is incident on such a micro prism, the angle of refraction varies according to its wavelength, so does its path. That is why by adjusting the length L of such a micro prism, the point of incidence of each color ray on the photosensitive plane of a photosensitive cell can be controlled.

FIG. 12 illustrates a situation where the blue (B) ray is directed toward a cell that is located diagonally below the micro prism, and its complementary color ray (yellow (Ye) =red (R)+green (G)) is directed toward a cell located right under the micro prism. By adjusting the length L of the micro prism and its position with respect to its associated photosensitive cell, the colors of rays to be incident on a photosensitive cell right under the micro prism can be changed. To spatially split incoming light into multiple components of light falling within mutually different wavelength ranges will be referred to herein as "splitting of light".

Thus, the prism type dispersive element shown in FIG. 12 can transmit a light ray falling within a first wavelength range toward a direction that defines a first angle with respect to the incoming light and can also transmit a light ray falling within a second wavelength range (and representing the complementary color of that of the light ray falling within the first wavelength range) toward a direction that defines a second angle with respect to the incoming light. Optionally, by adjusting its length L and its relative position with respect to its associated photosensitive cell, light rays falling within respectively different wavelength ranges can also be transmitted in three different directions. Each of those split light rays falling within the respective wavelength ranges is in a plane including the incoming light. That is why if the dispersive element being arranged is turned on the optical axis of the incoming light, then the direction of that plane including the split light ray can be changed.

An array of dispersive elements, including such dispersive elements, may be fabricated by performing thin-film deposition and patterning processes by known semiconductor device processing technologies. Those dispersive elements may be arranged two-dimensionally in any of various patterns. By appropriately determining the arrangement pattern of those dispersive elements, the incoming light can be split into light rays falling within desired wavelength ranges, or some of those split light rays can be combined together if necessary, before those light rays strike on their associated photosensitive cells that form an array of photosensitive cells. As a result, a signal representing a required color component can be derived from a set of photoelectrically converted signals supplied by the photosensitive cells.

Meanwhile, the micro prisms may be replaced with dispersive elements that use diffraction of light. A dispersive element of that type includes a high-refractive-index transparent member (which will be referred to herein as a "core portion"), which is made of a material with a relatively high refractive index, and a low-refractive-index transparent member (which will be referred to herein as a "clad portion"), which is made of a material with a relatively low refractive index and which contacts with the side surfaces of the core portion. The incoming light is diffracted due to a difference in refractive index between the core and clad portions. That is why a light ray falling within a first wavelength range may be refracted toward a direction that defines a first angle with respect to the incoming light and a light ray falling within a second wavelength range (and representing a complementary color with respect to the color of the light ray falling within the first wavelength range) may be refracted toward a direction that defines a second angle with respect to the incoming light. Optionally, three light rays falling within mutually different wavelength ranges may also be transmitted in three different directions, too. Since the incoming light can be split into multiple light rays due to the presence of the core portion, each high-refractive-index transparent member will be referred to herein as a sort of "dispersive element". Even with such a dispersive element that is made of two materials with mutually different refractive indices and that produces diffraction, color signals can also be obtained as efficiently as with micro prisms by making simple computations on the photoelectrically converted signals provided by the photosensitive cells.

Hereinafter, the solid state image sensor 103 of this preferred embodiment will be described in further detail with reference to FIGS. 6A and 6B.

Figure 6A:
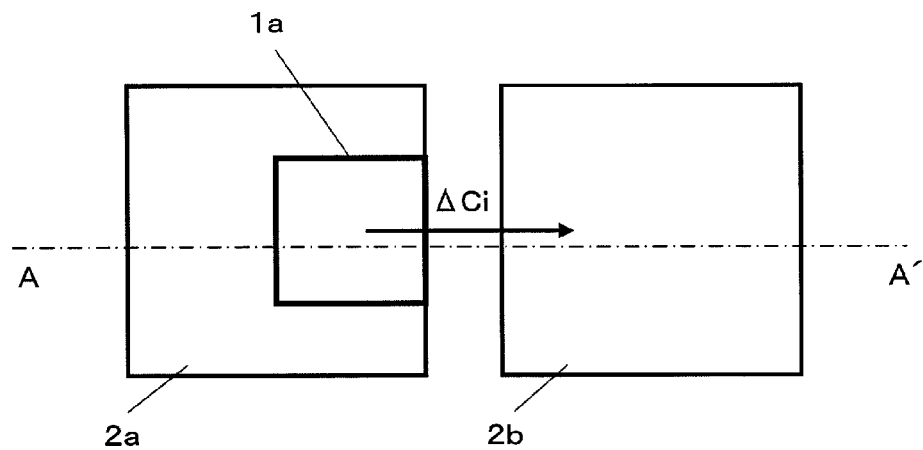
FIG. 6A is a plan view illustrating how a dispersive element and photosensitive cells may be arranged in the first preferred embodiment of the present invention when a micro prism is used as the dispersive element.
Figure 6B:
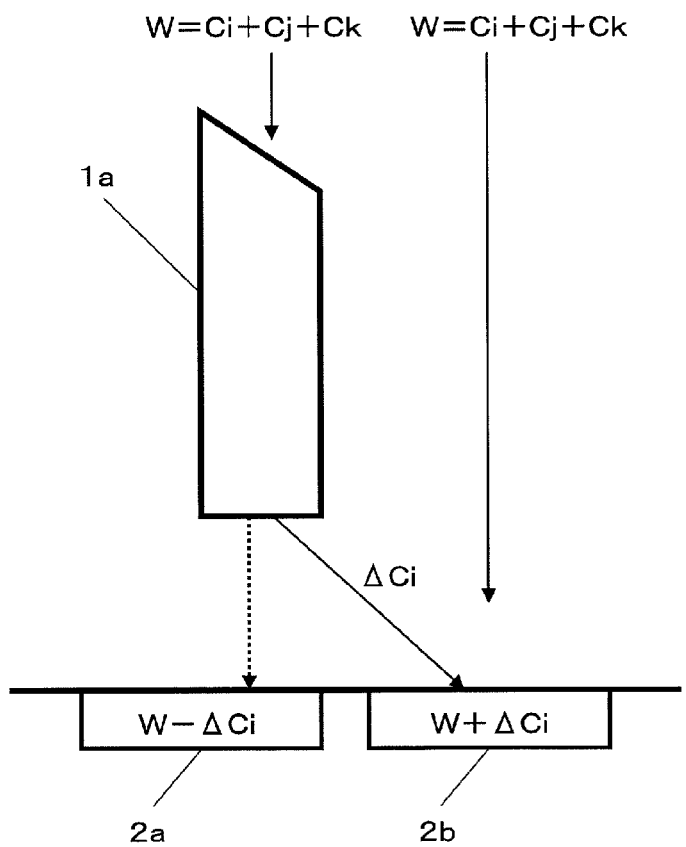
FIG. 6B is a cross-sectional view of the first preferred embodiment of the present invention as viewed on the plane A-A'.

FIG. 6A is a plan view illustrating the arrangement of photosensitive cells 2a, 2b and a micro prism 1a on the imaging area 103a of the solid state image sensor 103 of this preferred embodiment. In the arrangement illustrated in FIG. 6A, the micro prism 1a is used as a dispersive element. FIG. 6A illustrates a fundamental arrangement for obtaining one color component from two pixels. FIG. 6B is a cross-sectional view as viewed on the plane A-A' shown in FIG. 6A.

The solid state image sensor 103 of this preferred embodiment includes multiple units, each of which includes photosensitive cells 2a, 2b and a micro prism 1a that is arranged to face the photosensitive cell 2a. On each of those units, enters the light (i.e., visible radiation) that has come from the top of the paper on which FIG. 6B is drawn. In this example, the wavelength range of the visible radiation entering each unit is divided into first, second and third wavelength ranges and color components associated with those wavelength ranges will be identified herein by I, J and K, respectively, for convenience sake. Each of these color components I, J and K is typically one of R (red), G (green) and B (blue) components but may also be any other color component as well. In the following description, light rays representing I, J and K color components will sometimes be referred to herein as "I, J and K light rays". Were it not for the array of dispersive elements, the quantity W of the light incident on the photosensitive cells 2a and 2b would be represented by W=Ci+Cj+Ck, where Ci, Cj and Ck represent the quantities of respective parts of the incoming light that are associated with the I, J and K color components, respectively. In the following description, the light that would be directly incident on a photosensitive cell X if it were not for the array of dispersive elements will be referred to herein as the photosensitive cell's (X) entering light.

The micro prism 1a splits the incoming light into light rays falling within three wavelength ranges that are associated with the three colors of I, J and K, respectively. Also, the micro prism 1a makes a part of the photosensitive cell's (2a) entering light, which has the I component and which corresponds to the quantity ΔCi, incident on an adjacent pixel (i.e., the photosensitive cell 2b) and also makes the rest of the photosensitive cell's (2a) entering light incident on the photosensitive cell 2a that faces the micro prism 1a. In response, the photosensitive cells 2a and 2b subject their received light rays to photoelectric conversion, thereby outputting photoelectrically converted signals representing the respective quantities of light they have received.

By using such an arrangement, the quantity Ci of that part of the incoming light with the I component can be obtained. Hereinafter, it will be described exactly how to calculate Ci based on the photoelectrically converted signals provided by the photosensitive cells 2a and 2b.

Since the incoming light has been split by the micro prism 1a, the photosensitive cell 2a receives all of its own entering light except that part of the incoming light with the I component, of which the quantity is represented by ΔCi. Therefore, the overall quantity of the light received by the photosensitive cell 2a is represented by W−ΔCi. On the other hand, the photosensitive cell 2b receives not only the its own entering light but also that part of the incoming light that has come from the micro prism 1a and that has the quantity ΔCi. Therefore, the overall quantity of the light received by the photosensitive cell 2b is represented by W+ΔCi. Supposing the photoelectrically converted signals representing these quantities W, Ci and ΔCi are identified by Ws, Cis and ΔCis, respectively, the photoelectrically converted signals S2a and S2b provided by the photosensitive cells 2a and 2b are calculated by the following Equations (7) and (8):

$$S2a = Ws - \Delta Cis \quad (7)$$

$$S2b = Ws + \Delta Cis \quad (8)$$

And by subtracting Equation (7) from Equation (8), the following Equation (9) can be obtained:

$$S2b - S2a = 2\Delta Cis \quad (9)$$

As can be seen from Equation (9), a signal representing the difference 2ΔCi in the quantity of the I ray received by the photosensitive cells 2a and 2b can be obtained as a differential signal of the photosensitive cells 2a and 2b.

Furthermore, the image capture device of this preferred embodiment may also retain in advance the data representing the distribution of the I ray, which has been split by the micro prism 1a, among the respective pixels. For example, data representing the percentages of the respective quantities of I rays to be received by the photosensitive cells 2a and 2b with respect to the quantity Ci of the I ray included in the incoming light may be stored in the memory 201. By reference to such data, the ratio 2ΔCi/Ci of the quantity of light represented by the differential signal of the photosensitive cells 2a and 2b to that of the I ray included in the incoming light can be obtained. That is to say, as the relation between the quantity Ci of the I ray in the incoming light and the quantity ΔCi of the I ray to be incident on the adjacent pixel (i.e., the photosensitive cell 2b) can be known, Ci can be calculated based on the quantity ΔCi of the split I ray. It should be noted that the information representing the ratio of ΔCi to Ci does not always have to be stored in the memory 201. Alternatively, the signal processor may be designed so that the signal processing section can calculate Ci from ΔCi based on that ratio.

In this case, supposing the ratio of Ci to ΔCi (=Ci/ΔCi) is Ki, a signal representing a double of Cis can be obtained by multiplying 2ΔCis (calculated by Equation (9)) by Ki. Also, 2Ws can be obtained by adding S2a and S2b together. By getting these processing steps performed by a signal processing section, the quantity Ci of a part of the incoming light with one color component and the quantity W of the incoming light itself can be calculated based on the signals provided by two pixels.

As described above, in the image capture device of this preferred embodiment, two pixels are supposed to form a minimum unit and a dispersive element (e.g., a micro prism) is arranged to face one of the two pixels so that a part of the incoming light with one color component is also incident on the other pixel. By obtaining the ratios of the quantities of two split light rays associated with one color component and received by the respective pixels to that of that part of the incoming light with that color component in advance, the quantity of that color component part of the incoming light can be calculated.

In the image capture device of this preferred embodiment, the dispersive element just needs to be arranged so that a part of one photosensitive cell's light, which has one color component, is also incident on the other photosensitive cell. That is why the one dispersive element does not have to completely cover its associated photosensitive cell. For that reason, the cross section of the dispersive element on a plane that intersects with the length direction of the dispersive element at right angles (i.e., a plane that is substantially parallel to the imaging area) may be smaller than the photosensitive area of the photosensitive cell. On top of that, as the dispersive element does not have to pass all of that part of the incoming light with the one color component to that other pixel adjacent to the one pixel that faces it, the dispersive element does not need to split the incoming light so perfectly and can be made relatively easily, which is one of the beneficial practical features of the present invention.

Figure 7:
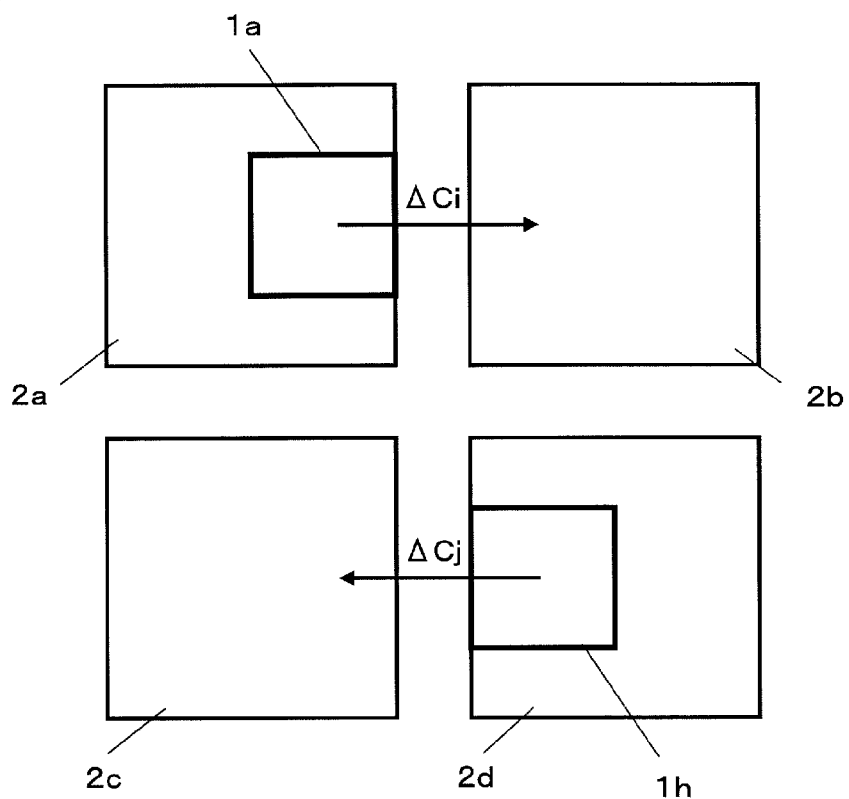
FIG. 7 is a plan view illustrating how dispersive elements and photosensitive cells may be arranged in the first preferred embodiment of the present invention to obtain three color components.

In the foregoing description, an arrangement for obtaining the quantity of a part of the incoming light with one color component using two pixels as a unit has been described. By using two sets of such elements shown in FIG. 6A, the image sensor of this preferred embodiment can obtain the quantities of respective parts of the incoming light that are associated with the three color components. FIG. 7 illustrates an example of such a unit of the image sensor. In the arrangement shown in FIG. 7, each unit includes not only the elements shown in FIG. 6A but also two more photosensitive cells 2c, 2d and one more micro prism 1h. In this case, the micro prism 1h makes a part of the photosensitive cell's (2d) entering light, which falls within a wavelength range associated with a color component J and which has a quantity ΔCj, incident on the photosensitive cell 2c. With such an arrangement, a signal representing the quantity 2ΔCj can be obtained based on a differential signal of the photosensitive cells 2c and 2d. Therefore, if the relation between Cj and ΔCj is determined in advance, Cj can be obtained. And once Ci and Cj are known, the quantity Ck of the rest of the incoming light, which falls within a wavelength range associated with the other color component K, can also be calculated by W=Ci+Cj+Ck. As a result, information about the quantities of respective parts of the incoming light that are associated with the three color components Ci, Cj and Ck can be collected and a color image can be reproduced.

Figure 8:
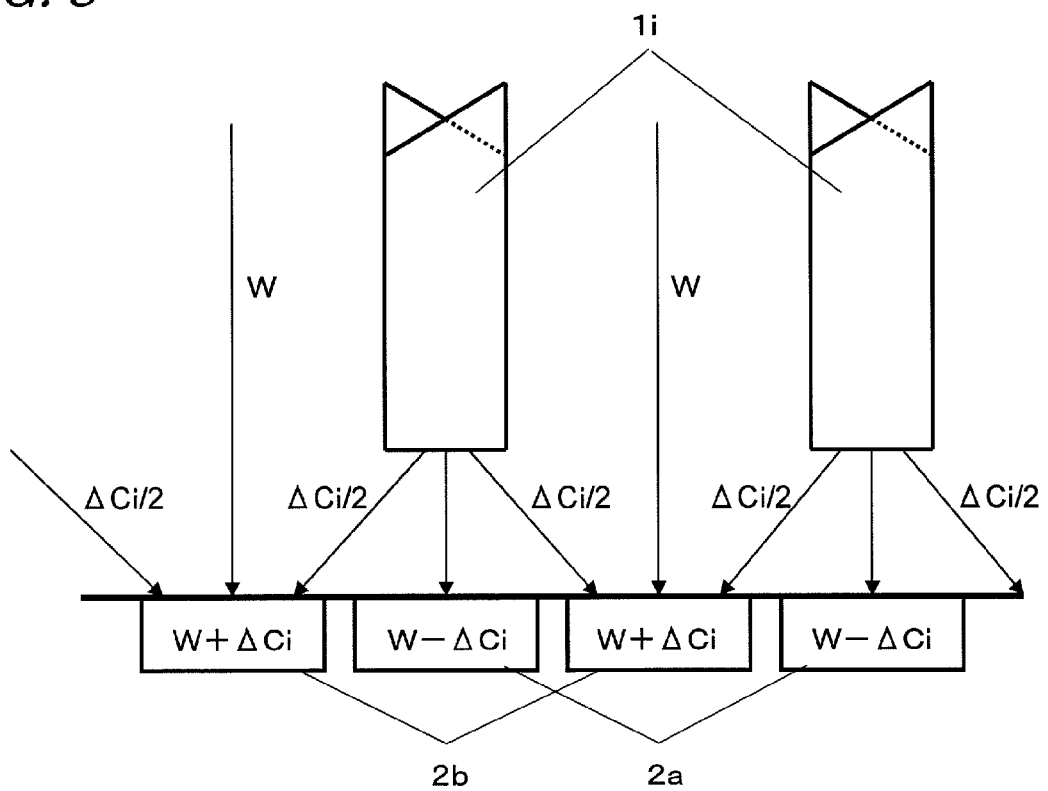
FIG. 8 illustrates an arrangement for a modified example of the first preferred embodiment of the present invention.
Figure 13:
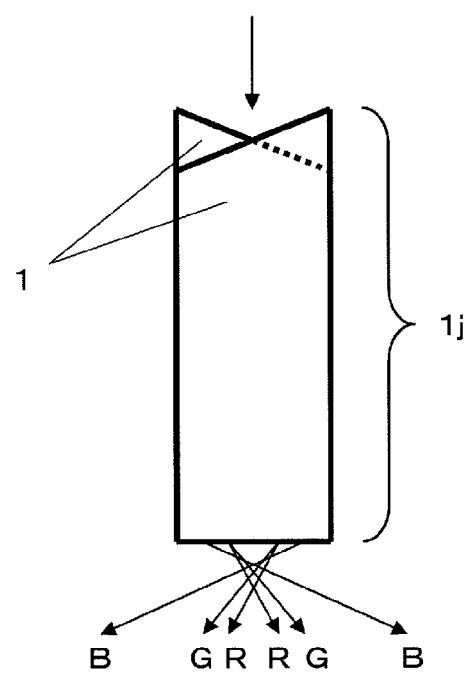
FIG. 13 illustrates the appearance of a micro prism for making respective parts of light in the same color incident on two adjacent pixels.
Figure 14:
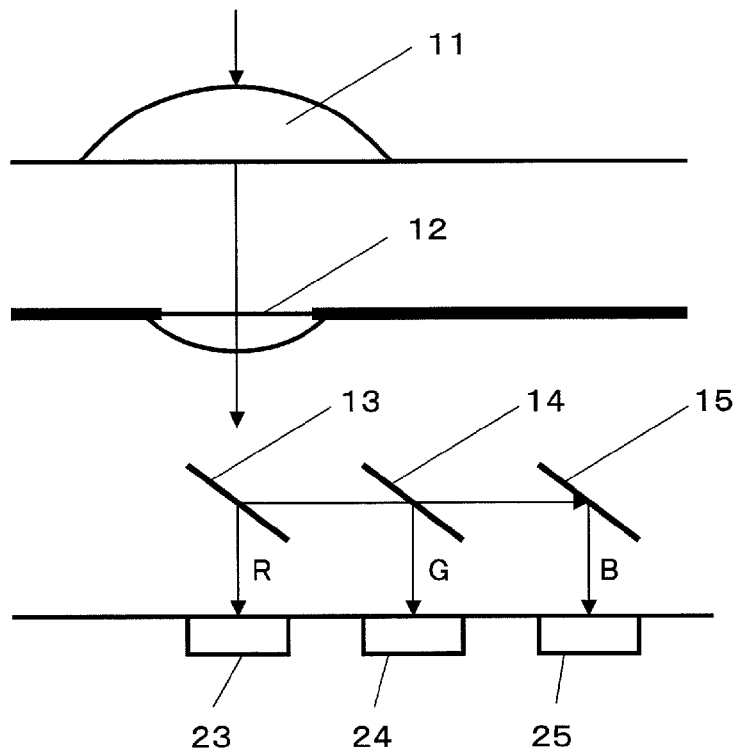
FIG. 14 is a cross-sectional view illustrating a conventional solid state image sensor that uses a micro lens and dichroic mirrors in combination.
Figure 15:
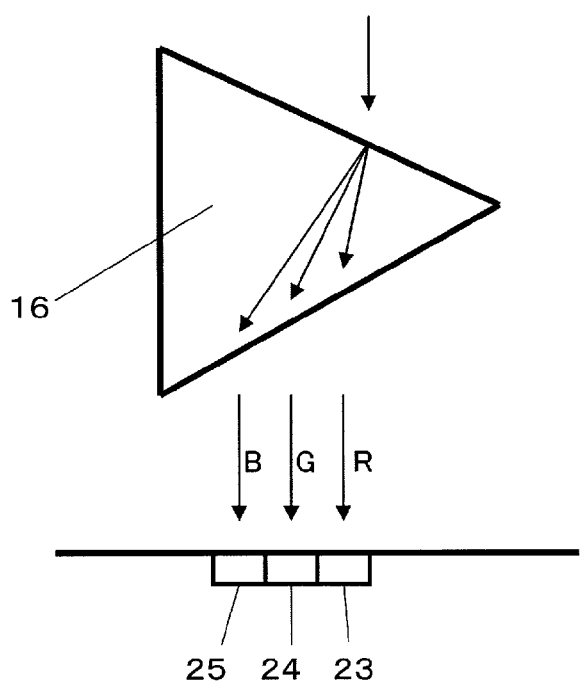
FIG. 15 illustrates how incoming light is split by a micro prism and then received according to a conventional technique.
Figure 16:
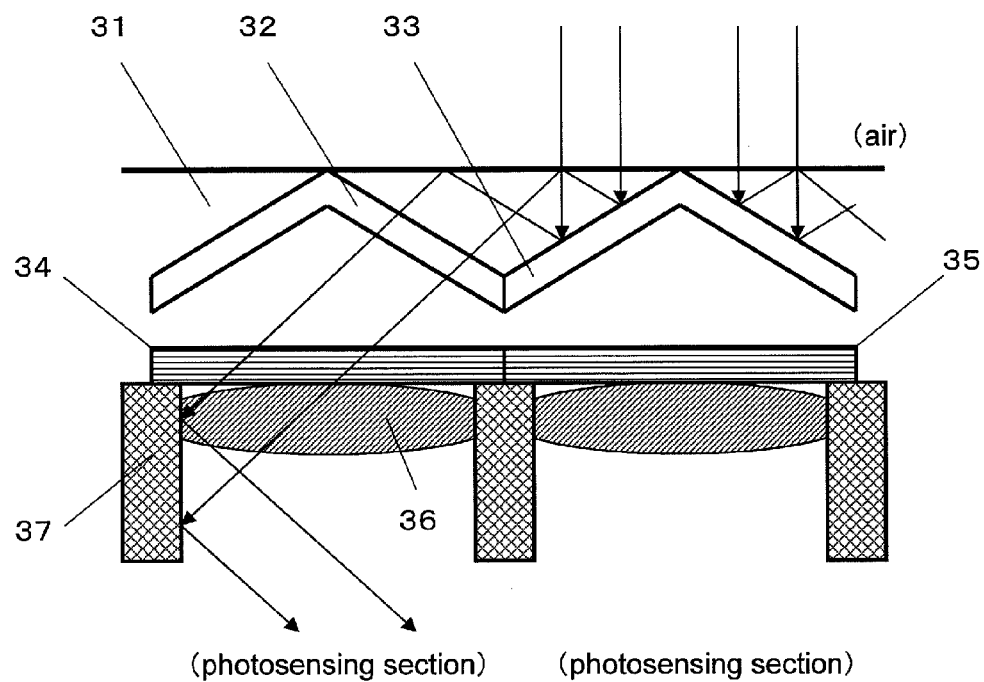
FIG. 16 is a cross-sectional view of an image sensor that achieves increased optical efficiency by using reflection by dichroic mirrors.

The micro prism of the preferred embodiment described above is designed so as to make a part of the incoming light with a first color component incident on two photosensitive cells. However, the micro prism may also be designed so as to make that part of the incoming light with the first color component incident on three or more photosensitive cells. FIG. 8 illustrates an example of an image sensor with such micro prisms. The image sensor shown in FIG. 8 includes a row of photosensitive cells, in which the photosensitive cells 2a and 2b are arranged in line alternately, and micro prisms 1i, each of which is arranged to face its associated one of the photosensitive cells 2a. Each micro prism 1i is designed to make halves of a part of its associated photosensitive cell's (2a) entering light, which have one color component and of which the quantities are ΔCi/2, incident on two associated photosensitive cells $2b$ that are adjacent to the photosensitive cell $2a$. With such an arrangement, the quantity of the light received by each photosensitive cell $2a$ is given by $W-\Delta Ci$ and that of the light received by each photosensitive cell $2b$ is given by $W+\Delta Ci$. That is why even with such an arrangement, the photoelectrically converted signals provided by the photosensitive cells $2a$ and $2b$ can also be calculated by Equations (7) and (8), respectively. As a result, Ci can be calculated based on the same principle. It should be noted that this micro prism $1i$ is formed by combining two micro prisms $1$ with each other so that the micro prisms $1$ face mutually different directions as shown in FIG. 13. Such a micro prism can refract two light rays having the same quantity toward two different directions. FIG. 13 illustrates a micro prism $1i$ that is designed to refract a B ray toward two different directions. However, this is just an example. The two light rays refracted by the micro prism $1i$ toward two photosensitive cells $2b$ may have any other color component.

The image capture device of the preferred embodiment described above uses a micro prism as a dispersive element. However, the dispersive element does not have to be a micro prism. Instead, any other kind of dispersive element may also be used as long as that element can split incoming light into multiple light rays according to the wavelength range. For example, a dispersive element that takes advantage of the diffraction of light as described above may be used. Optionally, in an image capture device as a modified example of this preferred embodiment, multiple dispersive elements may be arranged to face one pixel. Even so, the same effect will also be achieved as long as those dispersive elements are arranged so that the sum signal of two pixels is proportional to the quantity of the incoming light and that the differential signal thereof is proportional to the quantity of a part of the incoming light with one color component.

Embodiment 2

Hereinafter, a second preferred embodiment of the present invention will be described with reference to FIGS. 9A and 9B. The image capture device of this preferred embodiment has quite the same configuration as the counterpart of the first preferred embodiment described above except its image sensor. Thus, the following description will be focused on only the differences from the image capture device of the first preferred embodiment described above. In the following description, any component having substantially the same function as its counterpart of the image capture device of the first preferred embodiment described above will be identified by the same reference numeral as the one used for the first preferred embodiment.

Figure 9A:
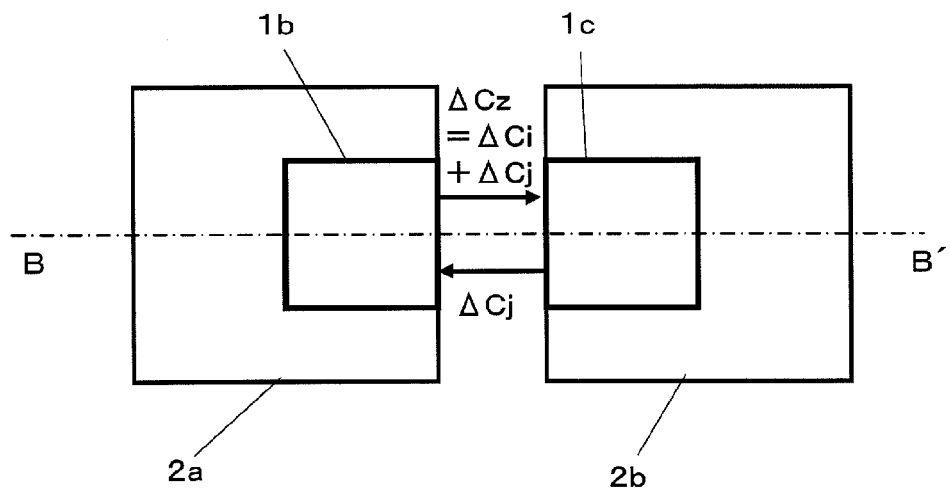
FIG. 9A is a plan view illustrating how dispersive elements and photosensitive cells may be arranged in a second specific preferred embodiment of the present invention when micro prisms are used as the dispersive elements.

FIG. 9A illustrates the arrangement of photosensitive cells and dispersive elements on the imaging area of an image sensor according to preferred embodiment. In the arrangement illustrated in FIG. 9A, two micro prisms $1b$ and $1c$ are used as dispersive elements. FIG. 9B is a cross-sectional view as viewed on the plane B-B' shown in FIG. 9A.

The image sensor of this preferred embodiment includes multiple units, each of which includes photosensitive cells $2a$ and $2b$ and micro prisms $1b$ and $1c$ that are arranged to face the photosensitive cells $2a$ and $2b$, respectively. On each of those units, enters the light that has come from top of the paper on which FIG. 9B is drawn. As in the image sensor of the first preferred embodiment described above, the quantity W of the light incident on the photosensitive cells $2a$ and $2b$ is also represented by $W=Ci+Cj+Ck$.

In this example, if the combination of I and J rays included in each photosensitive cell's light is referred to herein as "Z ray", the quantity Cz of the Z ray is represented by $Cz=Ci+Cj$. Also, if the respective color components I, J and K represent the primary colors, the K and Z rays will represent a primary color and its complementary color because $W=Ci+Cj+Ck$. The micro prism $1b$ of this preferred embodiment is arranged to make a part of the photosensitive cell's ($2a$) entering light, which includes a part of the Z ray and which has the quantity $\Delta Cz$, incident on an adjacent pixel (i.e., the photosensitive cell $2b$) and also make the rest of the photosensitive cell's ($2a$) entering light incident on the photosensitive cell $2a$ that faces the micro prism $1b$. In this case, if the quantities of the I and J rays included in $\Delta Cz$ are identified by $\Delta Ci$ and $\Delta Cj\_bb$, respectively, then $\Delta Cz=\Delta Ci+\Delta Cj\_bb$ is satisfied. That is to say, the micro prism $1b$ makes parts of the photosensitive cell's ($2a$) entering light, including the I ray with the quantity $\Delta Ci$ and the J ray with the quantity $\Delta Cj\_bb$, incident on the photosensitive cell $2b$ and also makes the rest of the cell's light (including the I ray with the quantity ($Ci-\Delta Ci$), the J ray with the quantity ($Cj-\Delta Cj\_bb$) and the K ray with the quantity Ck) incident on the photosensitive cell $2a$. On the other hand, the micro prism $1c$ is arranged to make a part of the J ray (with the quantity $\Delta Cj\_ca$) included in the photosensitive cell's ($2b$) entering light incident on the adjacent pixel (i.e., the photosensitive cell $2a$) and to make the rest of the cell's light (i.e., the I ray with the quantity Ci, the J ray with the quantity ($Cj-\Delta Cj\_ca$) and the K ray with the quantity Ck) incident on the photosensitive cell $2b$ that faces the micro prism $1c$.

The image capture device of this preferred embodiment is characterized by the following two points. Firstly, information about the distribution of the I ray split by the micro prisms $1b$ and $1c$ among the respective pixels is stored in advance. Secondly, the micro prisms $1b$ and $1c$ are arranged so that the quantity $\Delta Cj\_bb$ of the J ray to be made incident on the photosensitive cell $2b$ by the micro prism $1b$ is equal to the quantity $\Delta Cj\_ca$ of the J ray to be made incident on the photosensitive cell $2a$ by the micro prism $1c$. That is to say, $\Delta Cj\_bb=\Delta Cj\_ca$ is satisfied. In FIGS. 9A and 9B, $\Delta Cj\_bb$ and $\Delta Cj\_ca$ are both simply identified by $\Delta Cj$.

By using such an arrangement, the quantity Ci of that part of the incoming light with the I component can be obtained. Hereinafter, it will be described exactly how to calculate the quantity Ci of that part of the incoming light with one color component based on the photoelectrically converted signals provided by the photosensitive cells $2a$ and $2b$.

First of all, light with the quantity W ($=Ci+Cj+Ck$) is incident on the photosensitive cells $2a$ and $2b$ of the image sensor. As the incoming light is split by the micro prism $1b$, the photosensitive cell $2a$ receives its own entering light except the Z ray with the quantity $\Delta Cz$. Meanwhile, as the incoming light is also split by the micro prism $1c$, the photosensitive cell $2a$ also receives the J ray with the quantity $\Delta Cj\_ca$. On the other hand, as the incoming light is split by the micro prism $1c$, the adjacent pixel (i.e., the photosensitive cell $2b$) for the photosensitive cell $2a$ receives its own entering light except a part of the J ray with the quantity $\Delta Cj\_ca$. Also, as the incoming light is split by the micro prism $1b$, the photosensitive cell $2b$ receives the I ray with the quantity $\Delta Ci$ and the J ray with the quantity $\Delta Cj\_bb$. Suppose the photoelectrically converted signals representing these quantities W, $\Delta Ci$, $\Delta Cj\_bb$, and $\Delta Cj\_ca$ are identified by Ws, $\Delta Cis$, $\Delta Cjs\_bb$, and $\Delta Cjs\_ca$, respectively. In that case, the photoelectrically converted signals S$2a$ and S$2b$ provided by the photosensitive cells 2a and 2b are calculated by the following Equations (10) and (11), respectively:

$$S2a = Ws - \Delta Cis - \Delta Cjs\_bb + \Delta Cjs\_ca \quad (10)$$

$$S2b = Ws - \Delta Cjs\_ca + \Delta Cis \Delta Cjs\_bb \quad (11)$$

Since $\Delta Cjs\_bb = \Delta Cjs\_ca$ is satisfied in this preferred embodiment, these Equations (10) and (11) can be rewritten into the following Equations (12) and (13), respectively:

$$S2a = Ws - \Delta Cis \quad (12)$$

$$S2b = Ws + \Delta Cis \quad (13)$$

These Equations (12) and (13) are the same as Equations (7) and (8) that have already been described for the first preferred embodiment. By subtracting Equation (12) from Equation (13), the following Equation (14) can be derived:

$$S2b - S2a = 2\Delta Cis \quad (14)$$

As can be seen from Equation (14), a signal representing the difference $2\Delta Ci$ in the quantity of the I ray received by the photosensitive cells 2a and 2b can be obtained based on the differential signal of the photosensitive cells 2a and 2b.

Furthermore, the image capture device of this preferred embodiment stores beforehand information about the distribution of the I ray split by the micro prisms 1a and 1b among the respective pixels. For example, information about the ratios of the quantities of the I ray received by the photosensitive cells 2a and 2b to the quantity Ci of the I ray in the incoming light may be stored in the memory 201. By reference to such information, the ratio $2\Delta Ci/Ci$ of the quantity of light represented by the differential signal of the photosensitive cells 2a and 2b to the quantity of the I ray in the incoming light can be obtained. And by referring to the information about the ratio that has been stored in advance, the ratio Ki of the quantity Ci of the I ray in the incoming light to the quantity $\Delta Ci$ of that part of the I ray directed to the adjacent pixel ($= Ci/\Delta Ci$) can be obtained. By multiplying $2\Delta Cis$ obtained by Equation (14) by Ki, a signal representing a double of Cis can be obtained.

Also, by using two different photosensitive cells and micro prisms, a photoelectrically converted signal representing the light ray Cj can also be obtained. And once Ci and Cj are known, the quantity Ck of the rest of the incoming light can also be calculated by W==Ci+Cj+Ck. As a result, information about the quantities of respective parts of the incoming light that are associated with the three color components Ci, Cj and Ck can be collected and a color image can be reproduced.

As described above, in the image capture device of this preferred embodiment, two pixels are used as a minimum unit and the micro prisms 1b and 1c are arranged so as to face those two pixels. The micro prism 1b is arranged so as to make respective parts of the I ray and J ray components in the incoming light incident on a pixel (i.e., photosensitive cell 2b) adjacent to the pixel that faces it. On the other hand, the micro prism 1c is arranged so as to make a part of the J ray components in the incoming light incident on a pixel (i.e., photosensitive cell 2a) adjacent to the pixel that faces it. And these micro prisms are designed so that the quantity of the J ray component to be made incident on the photosensitive cell 2b by the micro prism 1b is equal to that of the J ray component to be made incident on the photosensitive cell 2a by the micro prism 1c. And by referring in advance to the distribution of the I ray component to be incident on the respective pixels, the quantity of the I ray component in the incoming light can be calculated. As the micro prism 1b has only to pass just a portion, not all, of that part of the incoming light with the one color component to that other pixel (i.e., the photosensitive cell 2b) adjacent to the one pixel that faces it, the dispersive element does not need to split the incoming light so perfectly and can be made relatively easily, which is one of the beneficial practical features of the present invention.

Figure 9B:
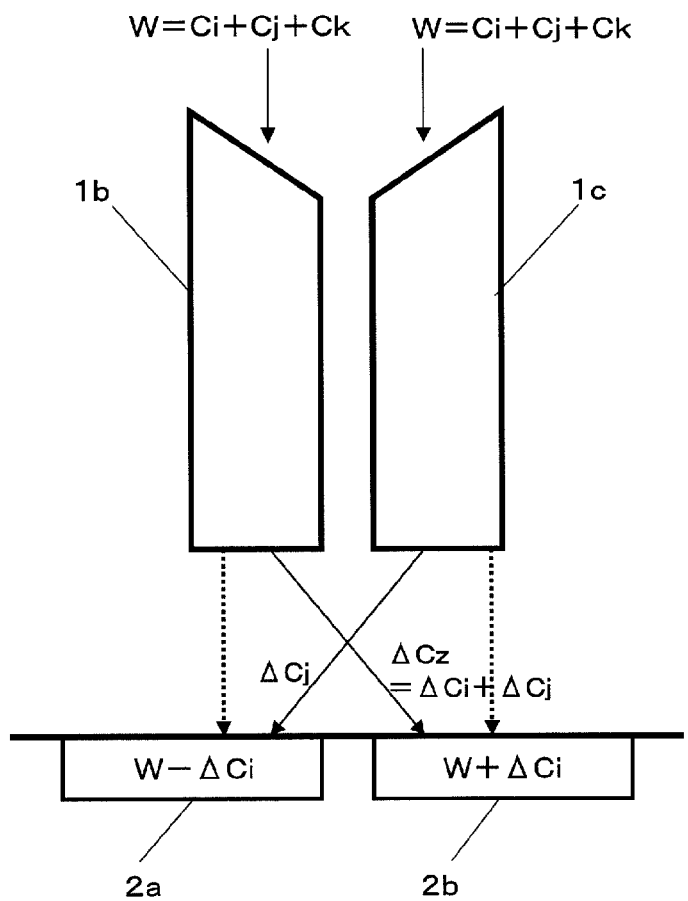
FIG. 9B is a cross-sectional view of the second preferred embodiment of the present invention as viewed on the plane B-B'.

In the image sensor shown in FIGS. 9A and 9B, the quantities of the respective J ray components received by the two photosensitive cells cancel each other, thereby making it possible to calculate the quantity of the I ray component in the incoming light. This can also be done even by using an image sensor that has a different arrangement from the one shown in FIGS. 9A and 9B. For example, the quantity of the one color component can also be obtained even by using the image sensor shown in FIG. 10.

Figure 10:
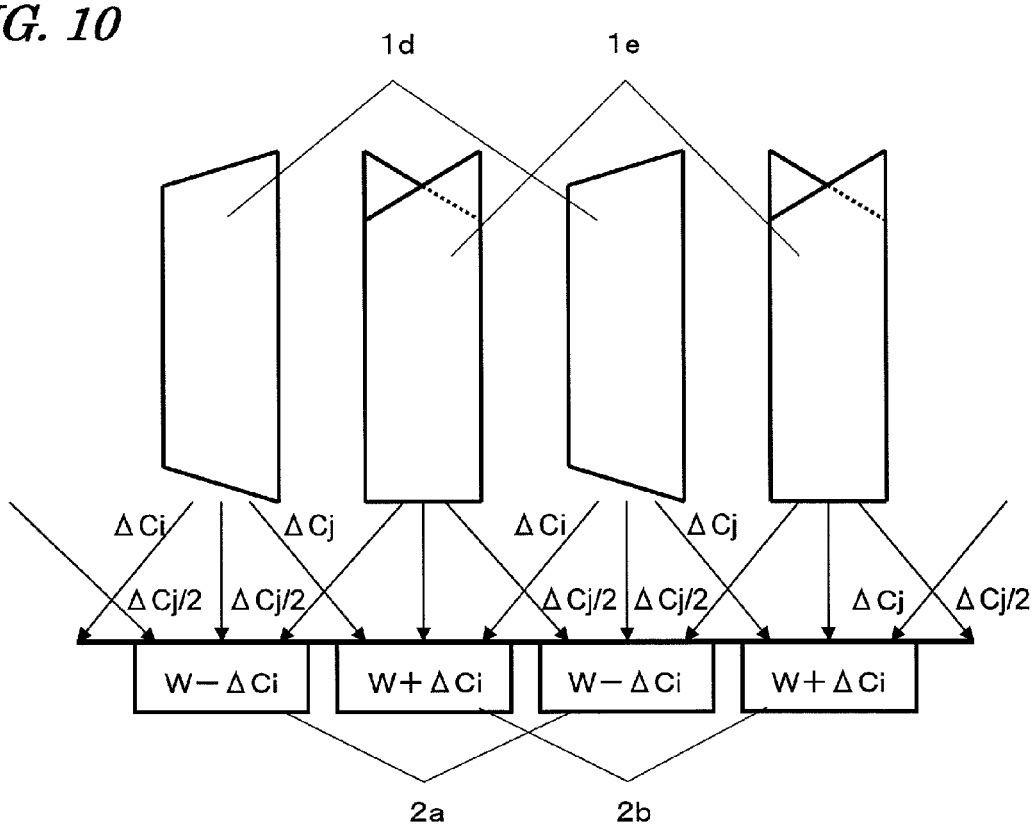
FIG. 10 illustrates an arrangement for a modified example of the second preferred embodiment of the present invention.

The image sensor shown in FIG. 10 includes a row of photosensitive cells in which the photosensitive cells 2a and 2b are arranged in line alternately, micro prisms 1d that are arranged to face the photosensitive cells 2a and micro prisms 1e that are arranged to face the photosensitive cells 2b. The micro prisms 1d are designed so as to split and direct the incoming light to a spatially broader range than the micro prisms 1b. Specifically, each of the micro prisms 1d is designed to make a part of the I ray (with the quantity $\Delta Ci$) and a part of the J ray (with the quantity $\Delta Cj$) in its associated photosensitive cell's (2a) entering light incident on two photosensitive cells 2b, respectively, which are adjacent to that photosensitive cell that faces it. On the other hand, each of the micro prisms 1e is designed so as to make halves of a part of the J ray (each having the quantity $\Delta Cj/2$) in its associated photosensitive cell's (2b) entering light incident on two photosensitive cells 2a, respectively, which are adjacent to that photosensitive cell 2b that faces it.

With such an arrangement, the quantity of the light received by each photosensitive cell 2a is given by $W-\Delta Ci$ and that of the light received by each photosensitive cell 2b is given by $W+\Delta Ci$. That is why even with such an arrangement, the photoelectrically converted signals provided by the photosensitive cells 2a and 2b can also be calculated by Equations (12) and (13), respectively. As a result, Ci can be calculated based on the same principle.

It should be noted that the micro prisms 1d are formed by cutting the non-machined side of the micro prism 1 shown in FIG. 12 so that both sides thereof are sloped. The micro prisms 1e are formed by combining two micro prisms 1 with each other so that the micro prisms 1 face mutually different directions as shown in FIG. 13. Such a micro prism can refract two light rays with one color component in the same quantity toward two different directions. FIG. 13 illustrates a micro prism 1j that is designed to refract a B ray toward two different directions. However, this is just an example. The two light rays refracted by the micro prism 1e toward two photosensitive cells 2b may have any other color component.

The image capture device of the preferred embodiment described above uses a micro prism as a dispersive element. However, the dispersive element does not have to be a micro prism. Instead, any other kind of dispersive element may also be used as long as that element can split incoming light into multiple light rays according to the wavelength range. For example, a dispersive element that takes advantage of the diffraction of light as described above may be used. Optionally, in an image capture device as a modified example of this preferred embodiment, multiple dispersive elements may be arranged to face one pixel. Even so, the same effect will also be achieved as long as those dispersive elements are arranged so that the sum signal of two pixels is proportional to the quantity of the incoming light and that the differential signal thereof is proportional to the quantity of a part of the incoming light with one color component.

Embodiment 3

Hereinafter, a third preferred embodiment of the present invention will be described with reference to FIG. 11. The image capture device of this preferred embodiment has quite the same configuration as the counterpart of the first preferred embodiment described above except its image sensor. Thus, the following description will be focused on only the differences from the image capture device of the first preferred embodiment described above. In the following description, any component having substantially the same function as its counterpart of the image capture device of the first preferred embodiment described above will be identified by the same reference numeral as the one used for the first preferred embodiment.

Figure 11:
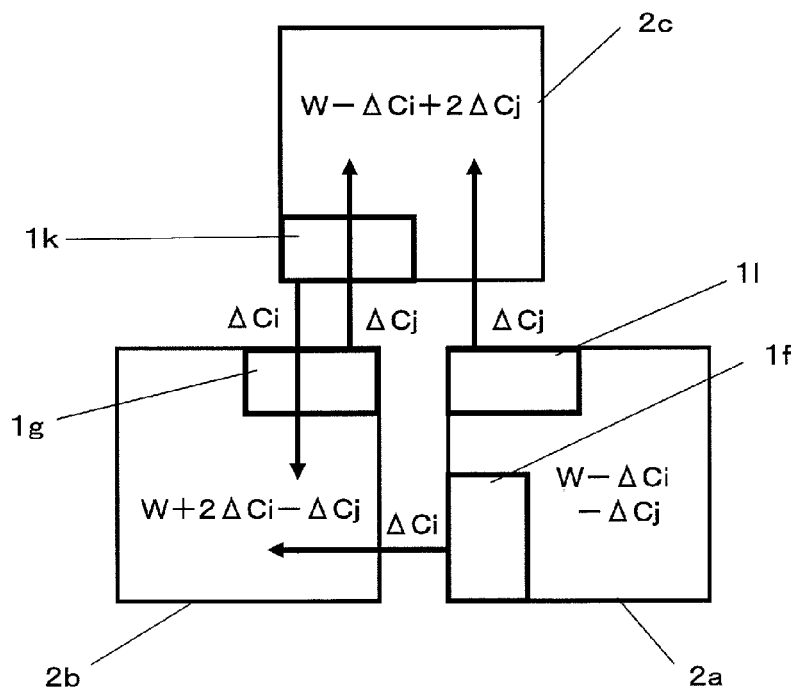
FIG. 11 is a plan view illustrating how dispersive elements and photosensitive cells may be arranged in a third specific preferred embodiment of the present invention.

FIG. 11 is a plan view illustrating a basic arrangement for obtaining two color components from three pixels by using two micro prisms of one type and two more micro prisms of another type as dispersive elements. The image sensor of this preferred embodiment has multiple units, each including photosensitive cells $2a$, $2b$ and $2c$, micro prisms $1f$ and $1l$ that are arranged to face the photosensitive cell $2a$, another micro prism $1g$ that is arranged to face the photosensitive cell $2c$, and still another micro prism $1k$ that is arranged to face the photosensitive cell $2b$. As in the image sensor of the first preferred embodiment described above, the quantity W of each photosensitive cell's light is represented by W=Ci+Cj+Ck.

Each of the micro prisms $1f$ and $1k$ is designed so as to make a part of the I ray component (with the quantity $\Delta$Ci) incident on a pixel adjacent to its associated pixel that faces it and to make the rest of the light incident on that associated pixel that faces it. On the other hand, each of the micro prisms $1g$ and $1l$ is designed so as to make a part of the J ray component (with the quantity $\Delta$Cj) incident on a pixel adjacent to its associated pixel that faces it and to make the rest of the light incident on that associated pixel that faces it. Also, the photosensitive cells $2a$, $2b$ and $2c$ are some of the pixels of the image sensor that photoelectrically convert the incoming light and output photoelectrically converted signals representing the intensity of the incoming light. In this preferred embodiment, the area in which the micro prisms $1f$ and $1g$ receive the incoming light is much smaller than the photosensitive area of each pixel.

The image capture device of this preferred embodiment is characterized by the following two points. Firstly, information about the distribution of the I and J rays split by the micro prisms $1f$, $1g$, $1k$ and $1l$ among the respective pixels is stored in advance. Then, the relation between the respective quantities Ci and Cj of the I and J rays included in the incoming light and the quantities $\Delta$Ci and $\Delta$cj of the light rays split and directed toward adjacent pixels is known and Ci and Cj can be calculated based on the quantities $\Delta$Ci and $\Delta$Cj of the light rays split. Secondly, the quantity of a part of the incoming light with a particular color component can be calculated by performing signal difference processing on a pixel on which the light with the particular color component is concentrated and a pixel on which that light is not concentrated.

Hereinafter, it will be described exactly how to calculate the quantities Ci and Cj of the light rays with the two color components based on the photoelectrically converted signals provided by the photosensitive cells $2a$, $2b$ and $2c$.

First of all, light with the quantity W (=Ci+Cj+Ck) is incident on the photosensitive cells $2a$, $2b$ and $2c$ of the image sensor. As the incoming light is split by the micro prisms $1f$, $1g$, $1k$ and $1l$, the respective photosensitive cells receive light rays in the following quantities. Specifically, the photosensitive cell $2a$ receives its own entering light except the I ray with the quantity $\Delta$Ci and the J ray with the quantity $\Delta$Cj. The photosensitive cell $2b$ receives not only its own entering light except the J ray with the quantity $\Delta$Cj but also the I ray with the quantity $\Delta$Ci that has come from the micro prism $1f$. And the photosensitive cell $2c$ receives not only its own entering light except the I ray with the quantity $\Delta$Ci but also the J rays with the quantity $\Delta$cj that have come from the micro prisms $1g$ and $1l$, respectively.

In this manner, light rays with the I component are concentrated on the photosensitive cell $2b$ and light rays with the J component are concentrated on the photosensitive cell $2c$ but no light rays with such a particular color component are concentrated on the photosensitive cell $2a$. Suppose the photoelectrically converted signals representing the light quantities W, Ci, Cj, $\Delta$Ci and $\Delta$Cj are identified by Ws, Cis, Cij, $\Delta$Cis and $\Delta$Cjs, respectively. Then, the photoelectrically converted signals S$2a$, S$2b$ and S$2c$ of the photosensitive cells $2a$, $2b$ and $2c$ are represented by the following Equations (15) to (17), respectively:

$$S2a = Ws - \Delta Cis - \Delta Cjs \quad (15)$$

$$S2b = Ws + 2\Delta Cis - \Delta Cjs \quad (16)$$

$$S2c = Ws - \Delta Cis + 2\Delta Cjs \quad (17)$$

By subtracting Equation (15) from Equation (16), the following Equation (18) is derived:

$$S2b - S2a = 3\Delta Cis \quad (18)$$

By subtracting Equation (15) from Equation (17), the following Equation (19) is derived:

$$S2c - S2a = 3\Delta Cjs \quad (19)$$

As can be seen from Equation (18), a signal 3$\Delta$Cis representing the difference 3$\Delta$Ci between the quantities of the I rays received by the photosensitive cells $2a$ and $2b$ can be obtained as a differential signal of the photosensitive cells $2a$ and $2b$. Also, as can be seen from Equation (19), a signal 3$\Delta$Cjs representing the difference 3$\Delta$Cj between the quantities of the J rays received by the photosensitive cells $2a$ and $2c$ can be obtained as a differential signal of the photosensitive cells $2a$ and $2c$.

As described above, the image capture device of this preferred embodiment stores in advance information about the relation between the quantity Ci of the I ray component in the incoming light and the quantity $\Delta$Ci of the I ray component directed by the micro prism $1f$, $1k$ toward its adjacent pixel. The device also stores in advance information about the relation between the quantity Cj of the J ray component in the incoming light and the quantity $\Delta$Cj of the J ray component directed by the micro prism $1g$, $1l$ toward its adjacent pixel. For example, information about the ratios of the quantities of I rays received by the photosensitive cells $2a$ and $2b$ to the quantity Ci of the I ray included in the incoming light may be stored in the memory 201. By reference to that information, the ratio (3$\Delta$Ci/Ci) of the light quantity represented by a differential signal of the photosensitive cells $2a$ and $2b$ to the quantity of the I ray included in the incoming light can be obtained. In the same way, information about the ratios of the quantities of J rays received by the photosensitive cells $2a$ and $2c$ to the quantity Cj of the J ray included in the incoming light may also be stored in the memory 201. By reference to that information, the ratio (3$\Delta$Cj/Cj) of the light quantity represented by a differential signal of the photosensitive cells $2a$ and $2c$ to the quantity of the J ray included in the incoming light can be obtained. And supposing Ci/$\Delta$Ci=Ki, a signal representing a triple of Cis can be obtained by multiplying 3$\Delta$ cis by Ki. Also, supposing Cj/ΔCj=Kj, a signal representing a triple of Cjs can be obtained by multiplying 3ΔCjs by Kj. Furthermore, by adding Equations (15), (16) and (17) together, 3Ws is obtained. Therefore, once Ci and Cj are known, the other light component Ck can also be obtained because W=Ci+Cj+Ck should be satisfied. As a result, information about the respective quantities Ci, Cj and Ck of light rays with the three color components included in the incoming light can be obtained and a color image can be reproduced.

As described above, the image capture device of this preferred embodiment uses three pixels as a unit and arranges one or more dispersive elements that face each of those pixels. Two micro prisms of one type and two more micro prisms of another type are provided as dispersive elements. Each of the micro prisms $1f$ and $1k$ is designed so as to make a part of the I ray component included in the incoming light incident on a pixel (i.e., photosensitive cell $2b$) adjacent to its associated pixel that faces it. As a result, the I ray component is concentrated on the photosensitive cell $2b$ compared to the other photosensitive cells. On the other hand, each of the micro prisms $1g$ and $1l$ is designed so as to make a part of the J ray component included in the incoming light incident on a pixel (i.e., photosensitive cell $2c$) adjacent to its associated pixel that faces it. As a result, the J ray component is concentrated on the photosensitive cell $2c$ compared to the other photosensitive cells. And by looking up in advance the distributions of the I and J ray components that have been split by the micro prisms and directed toward the respective pixels, the quantities of the I and J ray components in the incoming light can be calculated. In this manner, just by referring to only a part of the information about a light ray with one color component in the incoming light, the quantity of the light ray with that color component can be calculated, which is a beneficial effect. That is why there is no need to make all of the light with the required color component incident on the adjacent pixel. Consequently, the dispersive element does not need to split the incoming light so perfectly and can be made relatively easily, which is one of the beneficial practical features of the present invention.

The image capture device of the preferred embodiment described above uses a micro prism as a dispersive element. However, the dispersive element does not have to be a micro prism. Instead, any other kind of dispersive element may also be used as long as that element can split incoming light into multiple light rays according to the wavelength range. For example, a dispersive element that takes advantage of the diffraction of light as described above may be used. Optionally, in an image capture device as a modified example of this preferred embodiment, multiple dispersive elements may be arranged to face one pixel. Even so, the same effect will also be achieved as long as those dispersive elements are arranged so that the sum signal of three pixels is proportional to the quantity of the incoming light and that the differential signal of the two pixels is proportional to the quantity of a part of the incoming light with one color component.

Optionally, the unit does not have to include three pixels. Supposing n is an integer that is equal to or greater than two, the unit may include n pixels and may be designed so that light with one color component is concentrated on (n−1) pixels but that no light with any color component is concentrated on one pixel. With such an arrangement, the quantity of the light with that color component in the incoming light can be calculated by performing processing including calculating the difference between that pixel on which no light is concentrated and the other pixels on which light with one color component is concentrated.

In the foregoing description of the first through third preferred embodiments of the present invention, the arrangement of pixels is not particularly mentioned but is never limited to a particular one. That is to say, the technique of the present invention is applicable to both a two-dimensional square arrangement and an arrangement with a honeycomb structure alike. Likewise, the present invention is also applicable no less effectively to an image sensor that receives incident light on the entire surface such as a solid state image sensor of the reverse irradiation type, not just a solid state image sensor of the surface irradiation type.

INDUSTRIAL APPLICABILITY

The image capture device of the present invention can be used extensively in cameras that use a solid state image sensor for general consumers including so-called "digital cameras" and "digital movie cameras", solid-state camcorders for TV broadcast personnel, industrial solid-state surveillance cameras, and so on. It should be noted that the present invention is applicable to every kind of color cameras even if the image capture device is not a solid state image sensor.

REFERENCE SIGNS LIST

1, $1a$, $1b$, $1c$, $1d$, $1e$, $1f$, $1g$, $1h$, $1i$, $1j$, $1k$ and micro prism
$2a$, $2b$, $2c$, $2d$ photosensitive cell of image sensor
4 array of dispersive elements
11 micro lens
12 inner lens
13 dichroic mirror reflecting all rays but red (R) ray
14 dichroic mirror reflecting only green (G) ray
15 dichroic mirror reflecting only blue (B) ray
16 conventional micro prism
23, 24, 25 conventional image sensor's photosensing section
31 light transmitting resin
32 G ray transmitting dichroic mirror
33 R ray transmitting dichroic mirror
34 G ray transmitting organic dye filter
35 R ray transmitting organic dye filter
36 micro lens
37 metal layer
100 image capturing section
101 optical lens
102 optical plate
103 image sensor
103a imaging area
104 signal generating and pixel signal receiving section
200 signal processing section
201 memory
202 color signal generating section
203 video interface section

The invention claimed is:

1. An image capture device comprising:
   a number of pixels that are arranged two-dimensionally;
   a dispersive element array for splitting a part of incoming light, which is going to enter the respective pixels and which has at least one color component, so that a differential signal of two of the pixels is proportional to the quantity of that color component part of the incoming light entering the respective pixels; and
   a signal processing section for generating a color signal, representing the quantity of that color component part of the incoming light, based on not only the ratio of the differential signal to the quantity of that color component part of the incoming light entering the respective pixels but also the differential signal itself.

2. An image capture device comprising:
a solid state image sensor;
an optical system for producing an image on an imaging area of the solid state image sensor; and
a signal processing section for processing an electrical signal supplied from the solid state image sensor,
wherein the solid state image sensor includes
a photosensitive cell array including a number of photosensitive cells, and
a dispersive element array including a number of dispersive elements, and
wherein the photosensitive cell array and the dispersive element array are formed of a number of units, and
wherein each said unit includes
first and second photosensitive cells, and
a dispersive element, which is arranged to face the first photosensitive cell, and
wherein if the light that would be directly incident on each of the photosensitive cells, were it not for the dispersive element array, is called that photosensitive cell's light,
the dispersive element array is designed to make a part and another part of the first photosensitive cell's light, both of which fall within a first wavelength range associated with a first color component and of which the quantities define first and second ratios, respectively, with respect to the quantity of light that also falls within the first wavelength range and that is included in the first photosensitive cell's light, incident on the first and second photosensitive cells, respectively, and
wherein the first and second photosensitive cells respectively output first and second photoelectrically converted signals representing the quantities of the light received, and
wherein the signal processing section outputs a color signal representing the quantity of the light that falls within the first wavelength range and that is included in the first photosensitive cell's light by performing processing, including calculating the difference between the first and second photoelectrically converted signals, based on the first and second ratios.

3. The image capture device of claim 2, wherein the signal processing section includes a memory, and
wherein information about the first and second ratios is stored in the memory.

4. The image capture device of claim 2, wherein the dispersive element makes a part and at least another part of light that falls within the first wavelength range and that is included in the first photosensitive cell's light incident on the second and first photosensitive cells, respectively.

5. The image capture device of claim 4, wherein the dispersive element makes all of the light that falls within the first wavelength range and that is included in the first photosensitive cell's light incident on the first photosensitive cell except a part of that light that is incident on the second photosensitive cell.

6. The image capture device of claim 5, wherein the dispersive element makes all of the light that is included in the first photosensitive cell's light incident on the first photosensitive cell except a part of that light that is incident on the second photosensitive cell.

7. The image capture device of claim 5, wherein if said dispersive element is called a first dispersive element,
each said unit further includes a second dispersive element that is arranged to face the second photosensitive cell, and
wherein the first dispersive element makes a part of light that falls within a second wavelength range associated with a second color component and that is included in the first photosensitive cell's light incident on the second photosensitive cell and also makes not only the rest of the light that falls within the second wavelength range and that is included in the first photosensitive cell's light but also light that falls within a third wavelength range associated with a third color component and that is included in the first photosensitive cell's light, incident on the first photosensitive cell, and
wherein the second dispersive element makes a part and the rest of the light that falls within the second wavelength range and that is included in second photosensitive cell's light incident on the first and second photosensitive cells, respectively, and
wherein the quantity of the light falling within the second wavelength range that the first dispersive element makes incident on the second photosensitive cell is equal to that of the light falling within the second wavelength range that the second dispersive element makes incident on the first photosensitive cell.

8. The image capture device of claim 5, wherein if said dispersive element is called a first dispersive element,
each said unit further includes a second dispersive element that is arranged to face the second photosensitive cell, and
wherein the first dispersive element makes a part of light that falls within a second wavelength range associated with a second color component and that is included in the first photosensitive cell's light incident on a third photosensitive cell, which is included in a first adjacent unit, and also makes not only the rest of the light that falls within the second wavelength range and that is included in the first photosensitive cell's light but also light that falls within a third wavelength range associated with a third color component and that is included in the first photosensitive cell's light, incident on the first photosensitive cell, and
wherein the second dispersive element makes a part of light that falls within the second wavelength range and that is included in second photosensitive cell's light, incident on the first photosensitive cell and a fourth photosensitive cell, which is included in a second adjacent unit, so that the quantities of the light received by the first and fourth photosensitive cells are equal to each other, and also makes the rest of the light that is included in the second photosensitive cell's light incident on the second photosensitive cell, and
wherein the quantity of the light falling within the second wavelength range that the first dispersive element makes incident on the third photosensitive cell is equal to the sum of the quantities of the light falling within the second wavelength range that the second dispersive element makes incident on the first and fourth photosensitive cells.

9. The image capture device of claim 5, wherein if said dispersive element is called a first dispersive element,
each said unit further includes:
a third photosensitive cell;
a second dispersive element, which is arranged to face the second photosensitive cell;
a third dispersive element, which is arranged to face the third photosensitive cell; and
a fourth dispersive element, which is arranged to face the first photosensitive cell, and
wherein the first dispersive element makes light that falls within a third wavelength range associated with a third color component and that is included in the first photosensitive cell's light, incident on the first photosensitive cell, and wherein the fourth dispersive element makes a part of light that falls within a second wavelength range associated with a second color component and that is included in the first photosensitive cell's light incident on the third photosensitive cell and also makes not only the rest of the light that falls within the second wavelength range and that is included in the first photosensitive cell's light but also light that falls within the third wavelength range and that is included in the first photosensitive cell's light incident on the first photosensitive cell, and wherein the second dispersive element makes a part and the rest of light that falls within the second wavelength range and that is included in the second photosensitive cell's light incident on the third and second photosensitive cells, respectively, and wherein the third dispersive element makes a part and the rest of light that falls within the first wavelength range and that is included in the third photosensitive cell's light incident on the second and third photosensitive cells, respectively, and wherein the quantity of the light falling within the first wavelength range that the first dispersive element makes incident on the second photosensitive cell is equal to that of the light falling within the first wavelength range that the third dispersive element makes incident on the second photosensitive cell, and wherein the quantity of the light falling within the second wavelength range that the first dispersive element makes incident on the third photosensitive cell is equal to that of the light falling within the second wavelength range that the second dispersive element makes incident on the third photosensitive cell, and wherein the third photosensitive cell outputs a third photoelectrically converted signal representing the quantity of the light received, and wherein the signal processing section outputs a color signal representing the quantity of the light associated with the second color component that is included in the first photosensitive cell's light by performing processing, including calculating the difference between the first and third photoelectrically converted signals, based on the ratio of the quantity of the light falling within the second wavelength range to be received by the third photosensitive cell to that of the light falling within the second wavelength range that is included in the first photosensitive cell's light.

10. The image capture device of one of claim 2, wherein if said dispersive element is called a first dispersive element, each said unit further includes:
third and fourth photosensitive cells, and
a second dispersive element that is arranged to face the third photosensitive cell, and wherein the dispersive element array is designed to make a part and another part of the first photosensitive cell's light, both of which fall within a second wavelength range associated with a second color component and of which the quantities define third and fourth ratios, respectively, with respect to the quantity of light that also falls within the second wavelength range and that is included in third photosensitive cell's light, incident on the third and fourth photosensitive cells, respectively, and wherein the third and fourth photosensitive cells respectively output third and fourth photoelectrically converted signals representing the quantities of the light received, and wherein the signal processing section outputs a color signal representing the quantity of the light that falls within the second wavelength range and that is included in the third photosensitive cell's light by performing processing, including calculating the difference between the third and fourth photoelectrically converted signals, based on the third and fourth ratios.

11. A solid state image sensor comprising:
a photosensitive cell array including a number of photosensitive cells, and
a dispersive element array including a number of dispersive elements, and
wherein the photosensitive cell array and the dispersive element array are formed of a number of units, and
wherein each said unit includes
first and second photosensitive cells, and
a dispersive element, which is arranged to face the first photosensitive cell, and
wherein if the light that would be directly incident on each of the photosensitive cells, were it not for the dispersive element array, is called that photosensitive cell's light, the dispersive element array is designed to make a part and another part of the first photosensitive cell's light, both of which fall within a first wavelength range associated with a first color component and of which the quantities define first and second ratios, respectively, with respect to the quantity of light that also falls within the first wavelength range and that is included in the first photosensitive cell's light, incident on the first and second photosensitive cells, respectively, and wherein the first and second photosensitive cells respectively output first and second photoelectrically converted signals representing the quantities of the light received.

* * * * *

UNITED STATES PATENT AND TRADEMARK OFFICE
CERTIFICATE OF CORRECTION

PATENT NO. : 8,289,422 B2
APPLICATION NO. : 12/919520
DATED : October 16, 2012
INVENTOR(S) : Masao Hiramoto et al.

Page 1 of 1

It is certified that error appears in the above-identified patent and that said Letters Patent is hereby corrected as shown below:

In the Claims:

Column 25, line 49, "of one of" should read -- of --.

Signed and Sealed this
Twenty-first Day of May, 2013

Teresa Stanek Rea
*Acting Director of the United States Patent and Trademark Office*